(12) United States Patent
Otsuka et al.

(10) Patent No.: US 11,799,022 B2
(45) Date of Patent: Oct. 24, 2023

(54) SEMICONDUCTOR DEVICE COMPRISING A BUFFER LAYER INCLUDING A COMPLEX DEFECT OF INTERSTICE CARBON AND INTERSTICE OXYGEN

(71) Applicant: Mitsubishi Electric Corporation, Tokyo (JP)

(72) Inventors: Kakeru Otsuka, Tokyo (JP); Hayato Okamoto, Tokyo (JP); Katsumi Nakamura, Tokyo (JP); Koji Tanaka, Tokyo (JP); Koichi Nishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 92 days.

(21) Appl. No.: 17/242,587

(22) Filed: Apr. 28, 2021

(65) Prior Publication Data
US 2022/0115522 A1    Apr. 14, 2022

(30) Foreign Application Priority Data
Oct. 8, 2020    (JP) .................................. 2020-170457

(51) Int. Cl.
*H01L 29/739* (2006.01)
*H01L 29/66* (2006.01)
*H01L 27/06* (2006.01)

(52) U.S. Cl.
CPC ...... *H01L 29/7397* (2013.01); *H01L 27/0635* (2013.01); *H01L 29/66348* (2013.01)

(58) Field of Classification Search
CPC .................................................. H01L 29/7397
See application file for complete search history.

(56) References Cited

U.S. PATENT DOCUMENTS

2014/0246755 A1    9/2014    Yoshimura et al.
2020/0058645 A1*   2/2020    Harada ............... H01L 29/0696

FOREIGN PATENT DOCUMENTS

JP    2015-130524 A    7/2015

* cited by examiner

*Primary Examiner* — Matthew C Landau
*Assistant Examiner* — Mark Hatzilambrou
(74) *Attorney, Agent, or Firm* — Studebaker & Brackett PC

(57) ABSTRACT

A semiconductor device includes: a drift layer of a first conduction type provided in a semiconductor substrate having a first principal plane and a second principal plane opposed to the first principal plane; a first semiconductor layer of a second conduction type provided between the first principal plane of the semiconductor substrate and the drift layer and having impurity concentration higher than impurity concentration of the drift layer; a first buffer layer of a first conduction type provided between the second principal plane of the semiconductor substrate and the drift layer and having hydrogen-induced donors with impurity concentration higher than impurity concentration of the drift layer; and a second semiconductor layer of a first conduction type or a second conduction type provided between the second principal plane of the semiconductor substrate and the first buffer layer and having impurity concentration higher than impurity concentration of the drift layer, wherein the first buffer layer includes a complex defect of interstice carbon and interstice oxygen having density decreasing from the second principal plane side toward the first principal plane side.

11 Claims, 13 Drawing Sheets

A-A CROSS SECTION

B-B CROSS SECTION

SEMICONDUCTOR DEVICE COMPRISING A BUFFER LAYER INCLUDING A COMPLEX DEFECT OF INTERSTICE CARBON AND INTERSTICE OXYGEN

BACKGROUND OF THE INVENTION

Field

The present disclosure relates to a semiconductor device and a manufacturing method for a semiconductor device.

Background

In a semiconductor device such as a diode or an IGBT (Insulated Gate Bipolar Transistor), protons are injected into the back surface side of a semiconductor substrate thinned by grinding to form a buffer layer having hydrogen-induced donors and prevent a depletion layer extending from the front surface side of the semiconductor substrate from reaching the back surface of the semiconductor substrate. The semiconductor substrate is irradiated with charged particles such as electrons, protons, or helium to form crystal defects to be lifetime killers, which reduce a recombination life time of a carrier, in the semiconductor substrate and improve a switching characteristic.

In the conventional manufacturing method for the semiconductor device, after the semiconductor substrate is irradiated with an electron beam from the front surface side to form the crystal defects, heat treatment is performed for one hour or more and ten hours or less at temperature of 300° C. or higher and 500° C. or lower and an amount of the crystal defects is adjusted. Thereafter, after protons are injected from the back surface of the semiconductor substrate thinned by grinding, heat treatment is performed for one hour or more and ten hours or less at temperature of 350° C. or higher and 550° C. or lower and the injected protons are converted into the donors and the buffer layer having the hydrogen-induced donors is formed. In the conventional semiconductor device, the crystal defects formed by the electron beam irradiation are used as the lifetime killers and are used to improve a donor generation rate by the proton injection (see, for example, Japanese Patent Laid-Open No. 2015-130524).

SUMMARY

However, in the conventional semiconductor device, the crystal defects to be the lifetime killers are formed to improve the donor generation rate by the proton injection as well. Therefore, the problem is that variation in electric characteristics such as switching characteristics caused by a change in the crystal defects due to heat generated under a situation in which the semiconductor device is actually used is not considered at all.

An object of the present disclosure, which has been made in order to solve the problem described above, is to provide a semiconductor device having stable electric characteristics even if crystal defects to be lifetime killers are formed in a semiconductor substrate and a manufacturing method for the semiconductor device.

A semiconductor device according to the present disclosure includes: a drift layer of a first conduction type provided in a semiconductor substrate having a first principal plane and a second principal plane opposed to the first principal plane; a first semiconductor layer of a second conduction type provided between the first principal plane of the semiconductor substrate and the drift layer and having impurity concentration higher than impurity concentration of the drift layer; a first buffer layer of a first conduction type provided between the second principal plane of the semiconductor substrate and the drift layer and having hydrogen-induced donors with impurity concentration higher than impurity concentration of the drift layer; and a second semiconductor layer of a first conduction type or a second conduction type provided between the second principal plane of the semiconductor substrate and the first buffer layer and having impurity concentration higher than impurity concentration of the drift layer, wherein the first buffer layer includes a complex defect of interstice carbon and interstice oxygen having density decreasing from the second principal plane side toward the first principal plane side.

A manufacturing method for a semiconductor device according to the present disclosure includes: preparing a semiconductor substrate of a first conduction type having a first principal plane and a second principal plane opposed to the first principal plane and having carbon and oxygen; forming a first semiconductor layer of a second conduction type having impurity concentration higher than impurity concentration of the semiconductor substrate on the first principal plane side of the semiconductor substrate; after forming the first semiconductor layer, grinding the semiconductor substrate from the second principal plane side; after grinding the semiconductor substrate, forming a second semiconductor layer of a first conduction type or a second conduction type having impurity concentration higher than impurity concentration of the semiconductor substrate on the second principal plane side of the semiconductor substrate; after grinding the semiconductor substrate, injecting protons from the second principal plane side; a first heat treatment step of heating the semiconductor substrate at first temperature, converting the protons injected into the semiconductor substrate into hydrogen-induced donors, and forming a first buffer layer of a first conduction type having impurity concentration higher than the impurity concentration of the semiconductor substrate; after the first heat treatment step, a charged particle irradiating step of irradiating the semiconductor substrate with charged particles and forming a complex defect of interstice carbon and interstice oxygen and a complex defect of interstice carbon and lattice position carbon; and after the charged particle irradiating step, a second heat treatment step of heating the semiconductor substrate at second temperature lower than the first temperature and extinguishing the complex defect of interstice carbon and lattice position carbon.

According to the semiconductor device according to the present disclosure, it is possible to provide a semiconductor device having stable electrical characteristics even if crystal defects to be lifetime killers are formed in the semiconductor substrate.

Further, according to the manufacturing method for a semiconductor device according to the present disclosure, it is possible to provide a manufacturing method for a semiconductor device having stable electrical characteristics even if crystal defects to be lifetime killers are formed in the semiconductor substrate.

Other and further objects, features and advantages of the invention will appear more fully from the following description.

DESCRIPTION OF EMBODIMENTS

First Embodiment

Figure 1:
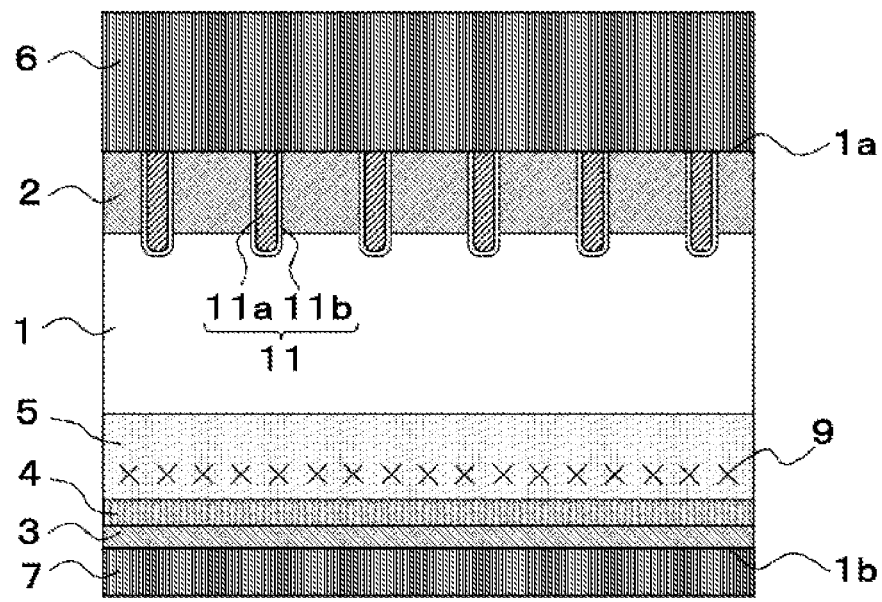
FIG. 1 is a sectional view illustrating a semiconductor device in the first embodiment.

First, the configuration of a semiconductor device in the first embodiment is explained. FIG. 1 is a sectional view illustrating a semiconductor device in the first embodiment.

In the following explanation, n and p indicate conduction types of semiconductors. In the present invention, a first conduction type is an n type and a second conduction type is a p type and n⁻ indicates that impurity concentration is lower than the impurity concentration of n and n⁺ indicates that impurity concentration is higher than the impurity concentration of n. Similarly, p⁻ indicates that impurity concentration is lower than the impurity concentration of p and p⁺ indicates that impurity concentration is higher than the impurity concentration of p.

In FIG. 1, a semiconductor device 100 is a diode and is formed using, for example, an n-type silicon semiconductor substrate grown by an FZ (Floating Zone) method or an MCZ (Magnetic field applied Czochralski) method. The semiconductor device 100 includes a first principal plane 1a of the semiconductor substrate and a second principal plane 1b opposed to the first principal plane 1a. Semiconductor layers are formed by introducing n type impurities or p type impurities between the first principal plane 1a and the second principal plane 1b of the semiconductor substrate. The rest of the semiconductor substrate is an n⁻ type drift layer 1. The n⁻ type drift layer 1 is a semiconductor layer having, for example, arsenic or phosphorus as an n type impurity. The concentration of the n type impurity is $1.0\times10^{12}/\text{cm}^3$ to $1.0\times10^{15}/\text{cm}^3$.

A p type anode layer 2 is provided between the first principal plane 1a of the semiconductor substrate and the n⁻ type drift layer 1. The p type anode layer 2 is a semiconductor layer having, for example, boron or aluminum as a p type impurity. The concentration of the p type impurity is $1.0\times10^{12}/\text{cm}^3$ to $1.0\times10^{19}/\text{cm}^3$. The p type anode layer 2 is a first semiconductor layer having impurity concentration higher than the impurity concentration of the n⁻ type drift layer 1.

An anode electrode 6, which is a first electrode, is provided on the first principal plane 1a of the semiconductor substrate. The anode electrode 6 is in contact with the p type anode layer 2 and is electrically connected to the p type anode layer 2. Note that, although not illustrated in FIG. 1, a p⁺ type contact layer having higher p type impurity concentration than the p type anode layer 2 may be provided between the p type anode layer 2 and the first principal plane 1a to electrically connect the p type anode layer 2 and the anode electrode 6 via the p⁺ type contact layer.

The anode electrode 6 may be formed of an aluminum alloy such as an aluminum silicon alloy (Al—Si-based alloy). The anode electrode 6 may be an electrode formed by a plurality of metal films obtained by electroless plating or electrolytic plating on an electrode formed of the aluminum alloy. The plating film formed by the electroless plating or the electrolytic plating may be, for example, a nickel plating film or may be, for example, a copper plating film. A gold plating film may be further formed on the nickel plating film or the copper plating film to prevent oxidation of nickel or copper. Barrier metal formed by a conductor including titanium may be provided between the anode electrode 6 and the first principal plane 1a of the semiconductor substrate. The anode electrode 6 including the barrier metal may be referred to as anode electrode 6.

The semiconductor device 100 includes diode trench gates 11 on the first principal plane 1a side of the semiconductor substrate. The diode trench gates 11 include diode trench electrodes 11a provided in trenches via oxide films 11b provided on the inner walls of the trenches passing through the p type anode layer 2 from the first principal plane 1a of the semiconductor substrate and reaching the n⁻ type drift layer 1. The diode trench electrodes 11a are in contact with the anode electrode 6 on the first principal plane 1a side and are electrically connected to the anode electrode 6. By providing the diode trench gates 11 in the semiconductor device 100, which is a diode, it is possible to improve a withstand voltage of the semiconductor device 100. However, since the semiconductor device 100 functions as a diode even if the diode trench gates 11 are absent, the diode trench gates 11 may not necessarily be provided.

An $n^+$ type cathode layer 3, a second buffer layer 4, and a first buffer layer 5 are provided in order from the second principal plane 1b side between the second principal plane 1b of the semiconductor substrate and the $n^-$ type drift layer 1. The first buffer layer 5 is an n type buffer layer having hydrogen-induced donors formed by proton injection and has n type impurity concentration higher than the n type impurity concentration of the $n^-$ type drift layer 1. The second buffer layer 4 is an n type buffer layer having phosphorus as an n type impurity and has n type impurity concentration higher than the n type impurity concentration of the first buffer layer 5. The $n^+$ type cathode layer 3 is an n type semiconductor layer having phosphorus or arsenic as an n type impurity and is a second semiconductor layer having n type impurity concentration higher than the n type impurity concentration of the $n^-$ type drift layer 1 and higher than the n type impurity concentration of the first buffer layer 5 or the second buffer layer 4. Note that, although not illustrated, a p type impurity may be introduced in a scattered manner into the $n^+$ type cathode layer 3, so that p type semiconductor layers may be scattered in the $n^+$ type cathode layer 3.

Note that, in FIG. 1, the semiconductor device 100 includes the second buffer layer 4 between the $n^+$ type cathode layer 3 and the first buffer layer 5. However, the semiconductor device 100 may not necessarily include the second buffer layer 4. That is, the semiconductor device 100 only has to include the first buffer layer 5 provided between the second principal plane 1b of the semiconductor substrate and the $n^-$ type drift layer 1 and the $n^+$ type cathode layer 3, which is the second semiconductor layer, provided between the second principal plane 1b of the semiconductor substrate and the first buffer layer 5.

A cathode electrode 7, which is a second electrode, is provided on the second principal plane 1b of the semiconductor substrate. The cathode electrode 7 is in contact with the $n^+$ type cathode layer 3 and is electrically connected to the $n^+$ type cathode layer 3. The cathode electrode 7 may be formed by sputtering or vapor-depositing a metal layer including at least one of Al, Ti, Ni, Au, Ag, and Cu on the $n^+$ type cathode layer 3, which is the second semiconductor layer. As with the anode electrode 6, the cathode electrode 7 may be obtained by forming a nickel plating film or a copper plating film by electroless plating or electrolytic plating on a metal film formed by sputtering or vapor deposition. Further, the cathode electrode 7 may be obtained by forming a gold plating film on the nickel plating film or the copper plating film.

In the semiconductor device 100, crystal defects 9 to be lifetime killers, which reduces a recombination life of a carrier, are formed in the semiconductor substrate. In FIG. 1, the crystal defects 9 to be the lifetime killers are illustrated in the first buffer layer 5. However, the crystal defects 9 to be the lifetime killers may be formed in the $n^-$ type drift layer 1 or may be formed in the second buffer layer 4 if the crystal defects 9 are formed at least in the first buffer layer 5. The crystal defects 9 to be the lifetime killers can be classified into several types according to structures. When the semiconductor device 100 is manufactured by a silicon semiconductor substrate, as the crystal defects 9 to be the lifetime killers, there are, for example, a void (V), interstice silicon (ISi), interstice carbon (Ci), lattice position carbon (Cs), a complex defect of void (V2, V4, or V6), a complex defect of interstice silicon (ISi3 or ISi4), a complex defect of interstice carbon and interstice oxygen (CiOi), and a complex defect of interstice carbon and lattice position carbon (CiCs). I or i indicates a state (Interstitial) in which atoms of silicon (Si), carbon (C), oxygen (O), or the like are located among lattices of Si crystal and s indicates a state (Substitutional) in which Si atoms in lattice positions of the Si crystal are substituted by other atoms.

The complex defect of interstice carbon and interstice oxygen (CiOi) is referred to as C center as well. Emitted light of 0.790 eV is obtained by photoluminescence. The complex defect of interstice carbon and lattice position carbon (CiCs) is referred to as G center as well. Emitted light of 0.969 eV is obtained by photoluminescence. The complex defect of interstice silicon (ISi3) is referred to as W center as well. Emitted light of 1.019 eV is obtained by photoluminescence. The complex defect of interstice silicon (ISi4) is referred to as X center as well. Emitted light of 1.040 eV is obtained by photoluminescence. The emitted lights of the C center, G center, W center, and the X center obtained by photoluminescence are respectively referred to as C-line, G-line, W-line, and X-line. In the following explanation, in some case, the complex defect of interstice carbon and interstice oxygen is referred to as CiOi, the complex defect of interstice carbon and lattice position carbon is referred to as CiCs, and the complex defect of interstice silicon is referred to as ISi3 or ISi4.

The semiconductor device 100 includes the complex defect of interstice carbon and interstice oxygen (CiOi) in the semiconductor substrate and includes the complex defect of interstice carbon and interstice oxygen (CiOi) at least in the first buffer layer 5. A crystal defect gradually disappears when the temperature of the semiconductor substrate is raised. However, a disappearing temperature of the CiOi is relatively higher compared with the other crystal defects. For example, the CiCs disappears at approximately 300° C. but the CiOi disappears at approximately 400° C. In the semiconductor device 100, the density of the CiOi included in the semiconductor substrate is larger than the density of the CiCs and the density of the CiOi included at least in the first buffer layer 5 is larger than the density of the CiCs.

Figure 2:
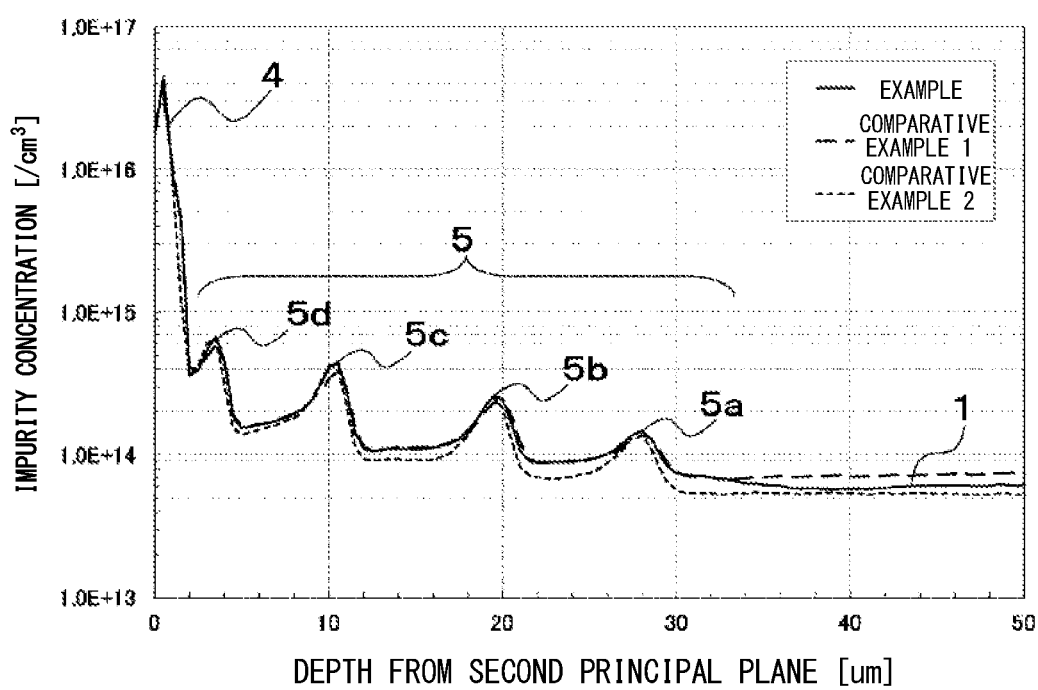
FIG. 2 is a diagram illustrating impurity concentration distributions of first buffer layers and second buffer layers of the semiconductor device in the first embodiment and semiconductor devices in comparative examples.

FIG. 2 is a diagram illustrating impurity concentration distributions of first buffer layers and second buffer layers of the semiconductor device in the first embodiment and semiconductor devices in comparative examples. In FIG. 2, an "example" indicated by a solid line is an impurity concentration distribution of the semiconductor device 100 in the first embodiment and a "comparative example 1" indicated by a broken line and a "comparative example 2" indicated by a dotted line are impurity concentration distributions of the semiconductor devices in the comparative examples. Impurity concentration is measured by a spreading resistance (SR) method. In FIG. 2, the axis of abscissas indicates depth from a second principal plane and the axis of ordinates indicates impurity concentration measured by the spreading resistance method.

The semiconductor device in the "example", which is the semiconductor device 100 in the first embodiment, and the semiconductor devices in the "comparative example 1" and the "comparative example 2" are respectively manufactured by different manufacturing methods. In the "example", the "comparative example 1", and the "comparative example 2", processes for forming the crystal defects 9 to be the lifetime killers are different from one another. The semiconductor device in the "example", which is the semiconductor device 100 in the first embodiment, is manufactured by, after injecting protons from the second principal plane 1b side of the semiconductor substrate, performing heat treatment for two hours at 400° C., which is a first temperature, and, thereafter, after irradiating the semiconductor substrate with an electron beam, performing heat treatment for 0.5 hour at 345° C., which is a second temperature. The semiconductor device in the "comparative example 1" is manufactured by, after irradiating the semiconductor substrate with an electron beam, injecting protons from the second principal plane 1b side of the semiconductor substrate, and, thereafter, heating the semiconductor substrate for two hours at 400° C. The semiconductor device in the "comparative example 2" is manufactured by, after injecting protons from the second principal plane 1b side of the semiconductor substrate, heating the semiconductor substrate for two hours at 400° C. In the semiconductor device in the "comparative example 2", electron beam irradiation is not performed. Note that details of the manufacturing method for the semiconductor device 100 in the first embodiment are explained below.

As illustrated in FIG. 2, the semiconductor device 100 includes the second buffer layer 4 having a concentration peak at 0.5 μm from the second principal plane 1b of the semiconductor substrate and present to the depth of 2 μm from the second principal plane 1b and the first buffer layer 5 spreading further to the first principal plane 1a side than the second buffer layer 4 and present to the depth of approximately 34 μm from the second principal plane 1b. A layer further on the first principal plane 1a side than the first buffer layer 5 is the n⁻ type drift layer 1. The second buffer layer 4 is a buffer layer having phosphorus. The first buffer layer 5 is a buffer layer having hydrogen-induced donors. As with the semiconductor device 100 in the example, the semiconductor devices in the comparative example 1 and the comparative example 2 include the second buffer layer 4 and the first buffer layer 5 and have similar impurity concentration distributions.

As illustrated in FIG. 2, the first buffer layer 5 includes four concentration peaks 5a, 5b, 5c, and 5d. However, the first buffer layer 5 may have four or more or four or less concertation peaks. The first buffer layer 5 only has to have at least one concentration peak having hydrogen-induced donors. Depths from the second principal plane 1b at which the concentration peaks of the first buffer layer 5 illustrated in FIG. 2 are positioned are 28.0 μm for the concentration peak 5a, 20.0 μm for the concentration peak 5b, 10.5 μm for the concentration peak 5c, and 3.5 μm for the concentration peak 5d. Maximum impurity concentration of the first buffer layer 5 is smaller than $1.0 \times 10^{15}/cm^3$. For example, maximum impurity concentration of the first buffer layer 5 of the semiconductor device 100 in the example illustrated in FIG. 2 is $7.0 \times 10^{14}/cm^3$ at the concentration peak 5d.

Subsequently, the crystal defects 9 to be the lifetime killers included in the semiconductor substrate of the semiconductor device 100 are explained. As explained above, there are several types of the crystal defects to be the lifetime killers. The crystal defects present in the semiconductor substrate of the semiconductor device 100 can be evaluated by, for example, irradiating the semiconductor substrate with a laser beam and measuring photoluminescence from the semiconductor substrate.

Figure 3:
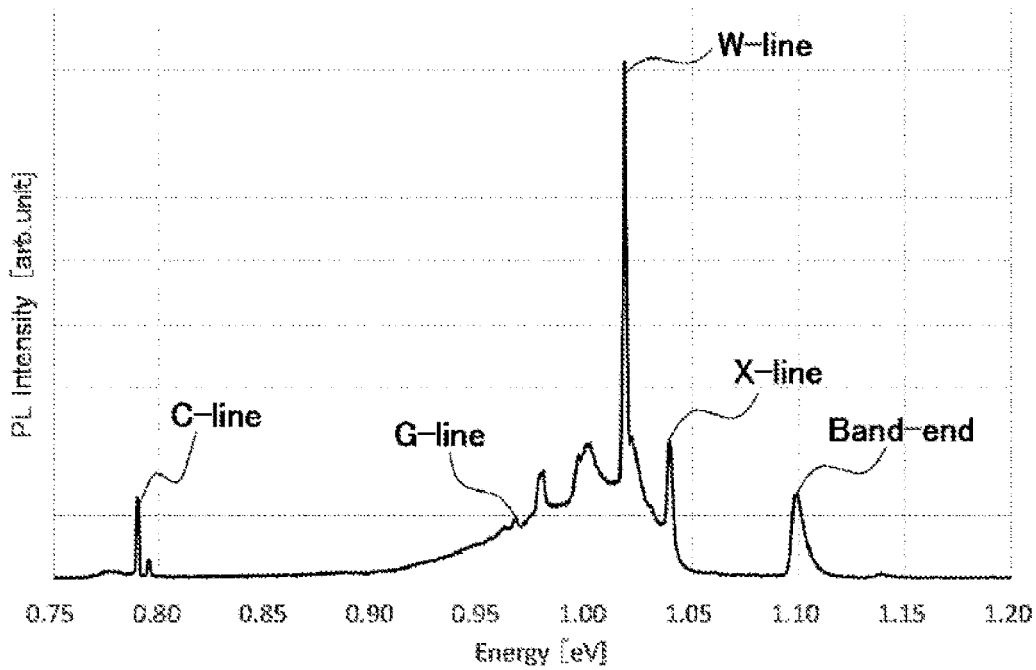
FIG. 3 is a diagram illustrating an example of a spectral distribution of photoluminescence of the semiconductor device in the first embodiment.

FIG. 3 is a diagram illustrating an example of a spectral distribution of photoluminescence of the semiconductor device in the first embodiment. In FIG. 3, the axis of abscissas indicates photon energy of the photoluminescence and the axis of ordinates indicates the intensity of the photoluminescence. The photon energy is converted from a relation of $E=h \cdot v=h \cdot c/\lambda$. E is photon energy, h is the Planck's constant, v is a frequency, c is light speed, and λ is a wavelength. The photoluminescence illustrated in FIG. 3 is obtained by cooling the semiconductor device 100 to temperature of 30K, irradiating the cross section of the semiconductor device 100 with a He—Ne laser beam having a wavelength of 633 nm, and detecting, with a spectrometer, emitted light from the cross section of the semiconductor device 100. A beam diameter of the irradiated He—Ne laser beam is 1.3 μm. Irradiation energy to the cross section of the semiconductor device 100 is 4.5 mW. FIG. 3 is a spectral distribution of the photoluminescence in a position of 4 m from the second principal plane 1b of the semiconductor device 100.

As illustrated in FIG. 3, in the spectral distribution of the photoluminescence of the semiconductor device 100, a C-line due to the CiOi, a G-line due to the CiCs, a W-line due to the ISi3, and an X-line due to the ISi4 are seen. A spectrum indicated by Band-end in FIG. 3 is band end emitted light of silicon.

FIGS. 4 to 7 are diagrams illustrating changes in crystal defect amounts with respect to depths from the second principal planes of the semiconductor device in the first embodiment and the semiconductor devices in the comparative examples. The "example", the "comparative example 1", and the "comparative example 2" illustrated in FIGS. 4 to 7 respectively correspond to those illustrated about the impurity concentration distributions in FIG. 2. In FIGS. 4 to 7, the axis of abscissas indicates depth from the second principal plane 1b and indicates that the positions of depths are irradiated with a He—Ne laser beam having a beam diameter of 1.3 μm. In FIGS. 4 to 7, on the axis of ordinates, photoluminescence intensities due to crystal defects from the cross section of the semiconductor device 100 are standardized such that the intensities of band end emitted lights of silicon at the depths are 1. In FIGS. 4 to 7, a measurement result of the semiconductor device in the "example" is indicated by filled circles, a measurement result of the semiconductor device in the comparative example 1 is indicated by hollow triangles, and a measurement result of the semiconductor device in the comparative example 2 is indicated by hollow squares.

In the spectrum of the photoluminescence illustrated in FIG. 3, the intensity of the photoluminescence on the axis of ordinates changes according to a factor other than the crystal defect amount when the depth from the second principal plane changes. However, the band end emitted light of silicon indicated by Band-end in FIG. 3 should not change according to the depth from the second principal plane unlike the crystal defects. Therefore, by standardizing the intensities of the band end emitted light of silicon to be fixed among a plurality of measurement data in which the depths from the second principal plane are different, it is possible to exclude factors of changes other than the crystal defect amount from the intensity changes of the photoluminescence due to the crystal defects. It is possible to measure a crystal defect amount corresponding to the depth from the second principal plane.

Note that the magnitude of Intensity/BE Intensity indicated on the axes of ordinates in FIGS. 4 to 7 can be evaluated as relatively indicating the crystal defect amount in the same photon energy. However, the magnitude of Intensity/BE Intensity cannot be compared between different photon energies in, for example, the C-line and the X-line to evaluate whether the crystal defect amount is large or small.

Figure 4:
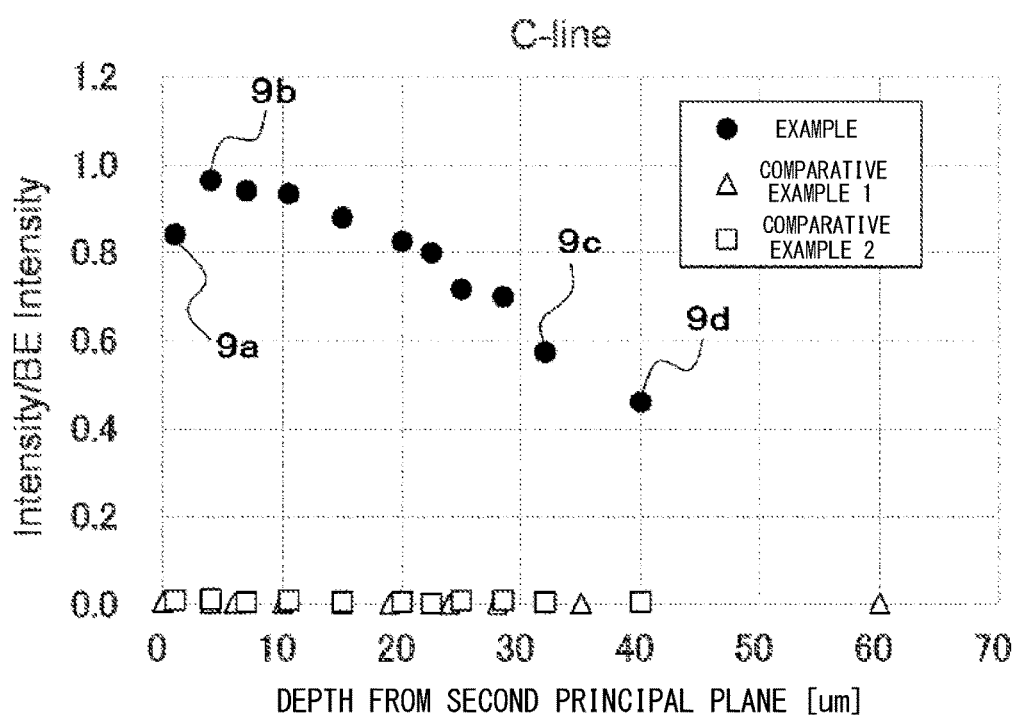
FIG. 4 is a diagram illustrating changes in crystal defect amounts with respect to depths from the second principal planes of the semiconductor device in the first embodiment and the semiconductor devices in the comparative examples.

As illustrated in FIG. 4, in the semiconductor device in the "example", which is the semiconductor device 100 in the first embodiment 1, the C-line, which is the photoluminescence of the CiOi, appears at all measurement depths from a filled circle 9a at 1 μm, which is a measurement depth closest to the second principal plane 1b, to a filled circle 9d at 40 μm, which is a measurement depth most distant from the second principal plane 1b. On the other hand, in the semiconductor device in the "comparative example 1" and the semiconductor device in the "comparative example 2", the C-line of significant magnitude does not appear. That is, the semiconductor device in the "comparative example 1" and the semiconductor device in the "comparative example 2" do not include the CiOi of significant density in the first buffer layer 5.

As illustrated in FIG. 2, the first buffer layer 5 of the semiconductor device 100 in the "example" is formed to depth of approximately 34 μm from the second principal plane 1b and a layer further on the first principal plane 1a side than the depth of 34 μm from the second principal plane 1b is the n⁻ type drift layer 1. As illustrated in FIG. 4, as indicated by the fact that the C-line is observed in the position of depth of 40 μm from the second principal plane 1b as well, the semiconductor device 100 in the "example" includes the CiOi as the crystal defects 9 to be the lifetime killers in the first buffer layer 5 and includes the CiOi in the second buffer layer 4 and the n type drift layer 1 as well. As illustrated in FIG. 2, since the depth from the second principal plane 1b of the concentration peak 5a closest to the first principal plane 1a among the plurality of concentration peaks of the first buffer layer 5 is 28.0 μm, the CiOi is present further on the first principal plane 1a side than the concentration peak 5a closest to the first principal plane 1a among the concentration peaks of the first buffer layer 5.

The semiconductor device 100 in the "example" has, in the first buffer layer 5, the CiOi illustrated at observation points of a filled circle 9b to the filled circle 9c illustrated in FIG. 4. The density of the CiOi in the first buffer layer 5 decreases from the second principal plane 1b side toward the first principal plane 1a side. The density of the CiOi of the first buffer layer 5 of the semiconductor device 100 decreases as the depth from the second principal plane 1b increases. However, a decreasing rate of the density of the CiOi is small in a position of small depth from the second principal plane 1b and increases as the depth from the second principal plane 1b increases.

Further, the semiconductor device 100 in the "example" includes the CiOi illustrated at an observation point of the filled circle 9a in FIG. 4 in the second buffer layer 4 present to the depth of 2 μm from the second principal plane 1b as well. The magnitude on the longitudinal axis of the filled circle 9a illustrated in FIG. 4 is smaller than the magnitude on the axis of ordinates of the filled circle 9b. That is, in the semiconductor device 100 in the "example", the density of the CiOi of the second buffer layer 4 is smaller than the maximum density of the CiOi of the first buffer layer 5.

Figure 5:
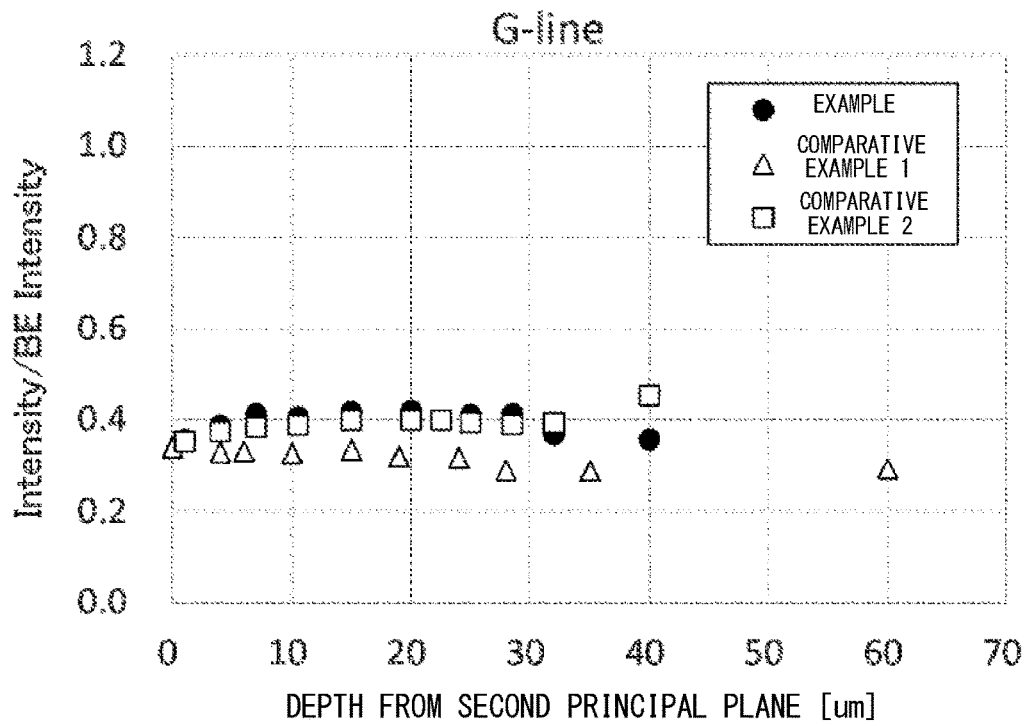
FIG. 5 is a diagram illustrating changes in crystal defect amounts with respect to depths from the second principal planes of the semiconductor device in the first embodiment and the semiconductor devices in the comparative examples.

As illustrated in FIG. 5, observation values of the G-lines of the semiconductor device in the "example", which is the semiconductor device 100 in the first embodiment, the semiconductor device in the "comparative example 1", and the semiconductor device in the "comparative example 2" indicate values of 0.3 to 0.4 irrespective of the distance from the second principal plane 1b. However, as can be seen from the spectral distribution of the photoluminescence illustrated in FIG. 3, emitted light having a broad spectral distribution is observed near the G-line and the G-line is superimposed on the broad emitted light and slightly observed. That is, although the observation values of 0.3 to 0.4 are obtained in FIG. 5, most of the observation values are observation values by the broad emitted light. Contribution of the G-line in FIG. 5 is extremely small. The G-line of significant magnitude is not observed. Therefore, the first buffer layer 5 of the semiconductor device 100 in the "example" does not include the CiCs having significant density. Similarly, the first buffer layer of the semiconductor device in the "comparative example 1" and the first buffer layer of the semiconductor device in the "comparative example 2" do not include the CiCs having the significant density. It is seen from the measurement results illustrated in FIGS. 4 and 5 that the density of the CiOi of the first buffer layer 5 of the semiconductor device 100 in the "example" is larger than the density of the CiCs present in the first buffer layer 5.

Figure 6:
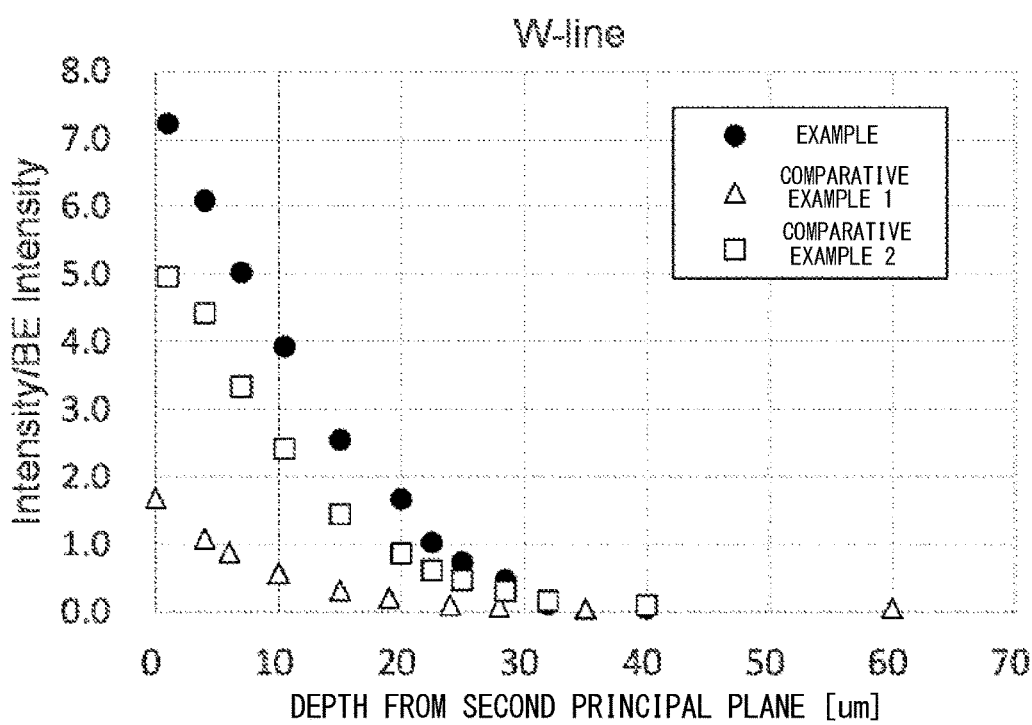
FIG. 6 is a diagram illustrating changes in crystal defect amounts with respect to depths from the second principal planes of the semiconductor device in the first embodiment and the semiconductor devices in the comparative examples.

As illustrated in FIG. 6, at the depth of 2 μm to 34 μm from the second principal plane on which the first buffer layer is present, the magnitude of the W-line is the largest in the semiconductor device 100 in the "example", is the second largest in the semiconductor device in the "comparative example 2", and is the smallest in the semiconductor device in the "comparative example 1". In all the semiconductor devices, the W-line is not observed in a significant degree in a position where the depth from the second principal plane on which the n⁻ type drift layer is present is larger than 34 μm. That is, in all the semiconductor devices, the ISi3 is not present in the n⁻ drift layer at significant density.

As illustrated in FIG. 6, the semiconductor device 100 in the "example" includes the ISi3 in the first buffer layer 5 and the second buffer layer 4. The density of the ISi3 of the first buffer layer 5 of the semiconductor device 100 decreases as the depth from the second principal plane 1b increases. However, a decreasing rate of the density of the ISi3 is large in a position of small depth from the second principal plane 1b and decreases as the depth from the second principal plane 1b increases. This tendency of the change in the defect density is different from the tendency of the CiOi illustrated in FIG. 4. That is, the first buffer layer 5 of the semiconductor device 100 includes a region where the decreasing rate of the density of the CiOi increases and the decreasing rate of the density of the ISi3 decreases from the second principal plane 1b side toward the first principal plane 1a side.

Figure 7:
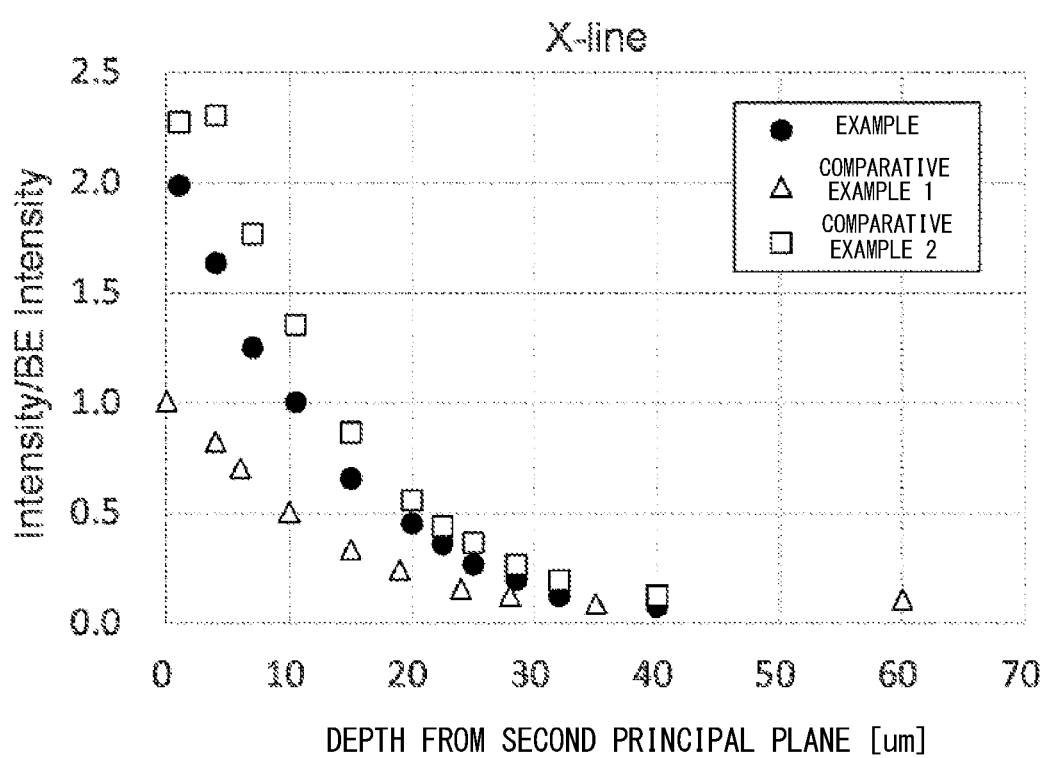
FIG. 7 is a diagram illustrating changes in crystal defect amounts with respect to depths from the second principal planes of the semiconductor device in the first embodiment and the semiconductor devices in the comparative examples.

As illustrated in FIG. 7, at the depth of 2 μm to 34 μm from the second principal plane on which the first buffer layer is present, the magnitude of the X-line is the largest in the semiconductor device in the "comparative example 1", is the second largest in the semiconductor device 100 in the "example", and is the smallest in the semiconductor device in the "comparative example 2". In all the semiconductor devices, observation values on the axis of ordinates are extremely small in deeper positions than 34 μm from the second principal plane on which the n-type drift layer is present. In all the semiconductor devices, the density of the ISi4 of the n⁻ type drift layer is 1/10 to 2/10 or less of the maximum density in the first buffer layer 5 or the second buffer layer 4.

As illustrated in FIG. 7, the semiconductor device 100 in the "example" includes the ISi4 in the first buffer layer 5 and the second buffer layer 4. As in the ISi3 illustrated in FIG. 6, the density of the ISi4 of the first buffer layer 5 of the semiconductor device 100 decreases as the depth from the second principal plane 1b increases. However, a decreasing rate of the density of the ISi4 is large in a position of small depth from the second principal plane 1b and decreases as the depth from the second principal plane 1b increases. This tendency of the change in the defect density is different from the tendency of the CiOi illustrated in FIG. 4. That is, the first buffer layer 5 of the semiconductor device 100 includes a region where the decreasing rate of the density of the CiOi increases and the decreasing rate of the density of the ISi4 decreases from the second principal plane 1b side toward the first principal plane 1a side.

The semiconductor device 100 in the first embodiment is configured as explained above.

Figure 8:
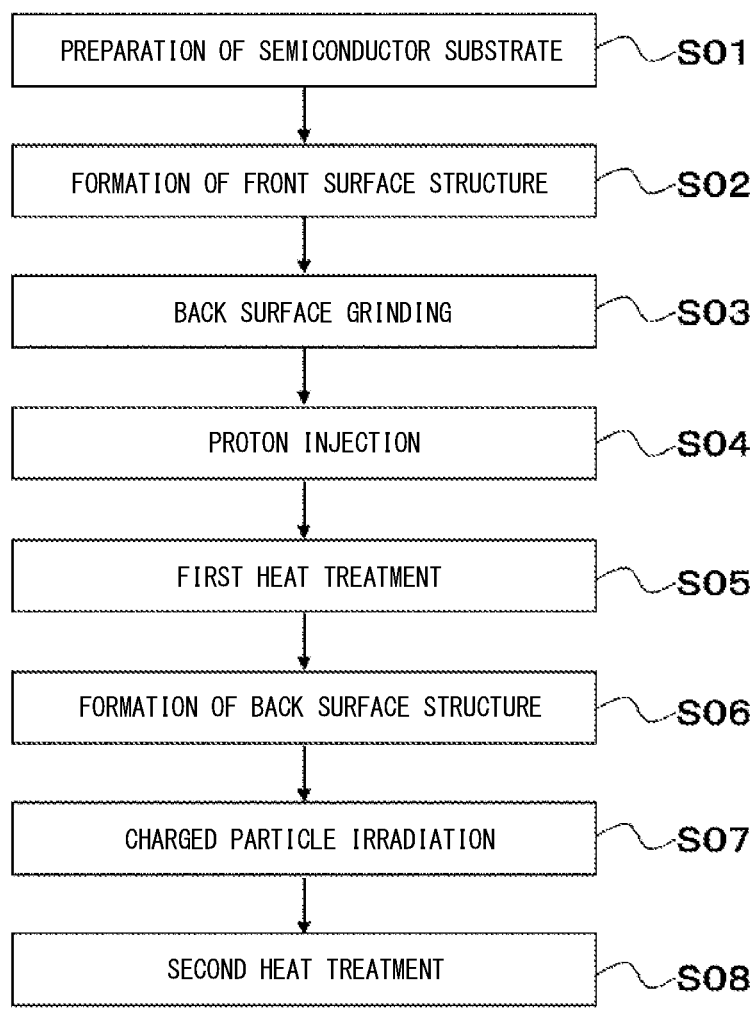
FIG. 8 is a flowchart illustrating the manufacturing method for the semiconductor in the first embodiment.

Subsequently, a manufacturing method for a semiconductor device in the first embodiment is explained. FIG. 8 is a flowchart illustrating the manufacturing method for the semiconductor in the first embodiment. FIGS. 9 to 17 are sectional views illustrating the manufacturing method for the semiconductor device in the first embodiment. In FIGS. 9 to 17, states halfway in a manufacturing process of the semiconductor device 100 are illustrated.

Figure 9:
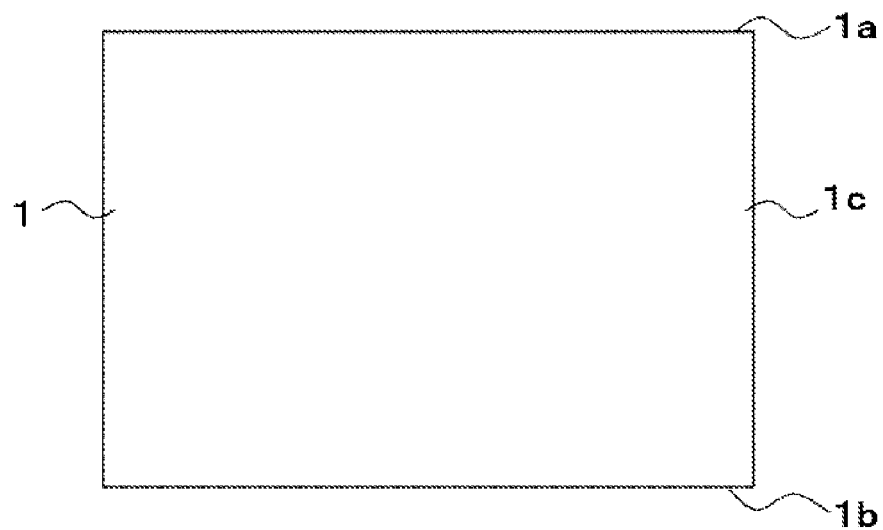
FIG. 9 is a sectional view illustrating the manufacturing method for the semiconductor device in the first embodiment.

First, in a process for preparing a semiconductor substrate in step S01 in FIG. 8, as illustrated in FIG. 9, a semiconductor substrate 1c including the first principal plane 1a and the second principal plane 1b opposed to the first principal plane 1a is prepared. The semiconductor substrate 1c is a semiconductor substrate including carbon and oxygen as impurities and may be, for example, a semiconductor substrate of silicon grown by the FZ method or the MCZ method. In the semiconductor substrate of silicon grown by the FZ method or the MCZ method, oxygen and carbon due to a growing process of bulk are included as impurities. The semiconductor substrate of silicon grown by the FZ method or the MCZ method has oxygen concentration of $1.0 \times 10^5$ to $2.0 \times 10^8 / cm^3$ and has carbon concentration of $3.0 \times 10^{13}$ to $2.0 \times 10^{15} / cm^3$. The semiconductor substrate of silicon grown by the MCZ method has oxygen concentration higher than the oxygen concentration of the semiconductor substrate of silicon grown by the FZ method. When the semiconductor substrate 1c is not the semiconductor substrate of silicon grown by the FZ method or the MCZ method but is a semiconductor substrate in which concentration of carbon or oxygen included as an impurity is low, the semiconductor substrate 1c may be a semiconductor substrate in which, after carbon or oxygen is injected into the semiconductor substrate, heat is diffused in the semiconductor substrate. Oxygen may be taken into the semiconductor substrate from the atmosphere or the oxidation atmosphere by heating treatment such as an oxide film formation process and an annealing process in the manufacturing process for the semiconductor device.

Figure 10:
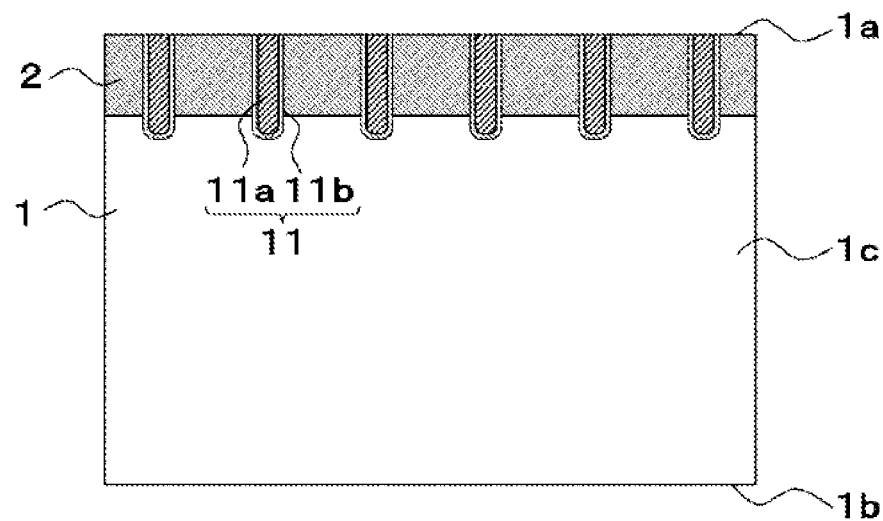
FIG. 10 is a sectional view illustrating the manufacturing method for the semiconductor device in the first embodiment.

Subsequently, in a forming step for a front surface structure in step S02 in FIG. 8, the p type anode layer 2, which is the first semiconductor layer, is formed on the first principal plane 1a side of the semiconductor substrate 1c. When the semiconductor device 100 includes the diode trench gates 11, the diode trench gates 11 are formed on the first principal plane 1a side of the semiconductor substrate 1c. A sectional view in a state in which the p type anode layer 2, which is the first semiconductor layer, and the diode trench gates 11 are formed on the first principal plane 1a side of the semiconductor substrate 1c is illustrated in FIG. 10.

First, after a p type impurity such as boron (B) is injected from the first principal plane 1a side of the semiconductor substrate 1c, the semiconductor substrate 1c is heated for one to eight hours at temperature equal to or higher than 1000° C. to diffuse impurity ions and form the p type anode layer 2. Subsequently, as illustrated in FIG. 10, after trenches passing through the p type anode layer 2 from the first principal plane 1a side of the semiconductor substrate 1c and reaching the n⁻ type drift layer 1 are formed, the semiconductor substrate 1c is heated in an atmosphere including oxygen to form the oxide film 11b on the inner walls of the trenches. Subsequently, polysilicon doped with an n type or p type impurity is deposited in the trenches, on the inner walls of which the oxide film 11b is formed, by CVD (chemical vapor deposition) or the like to form the diode trench electrodes 11a. The diode trench gates 11 are formed.

Figure 11:
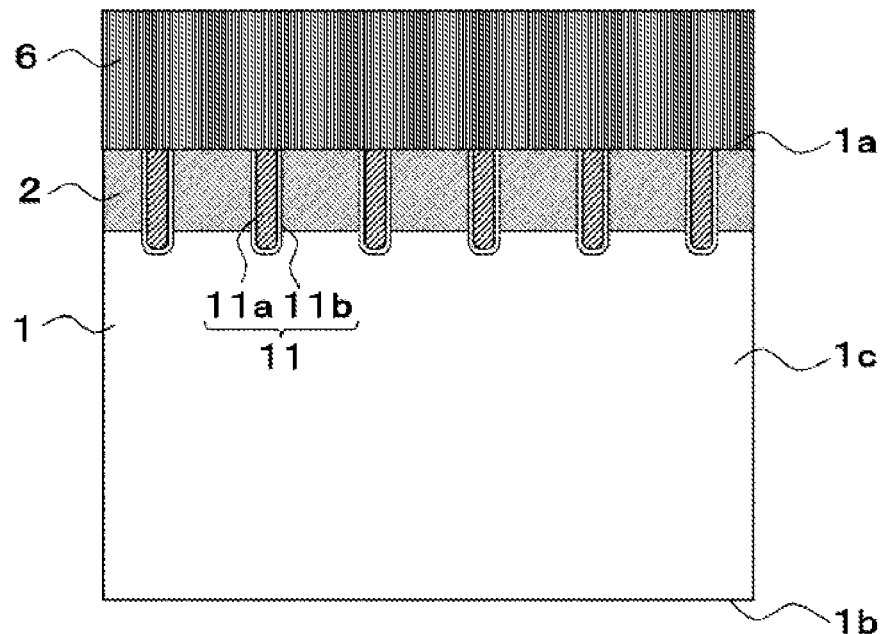
FIG. 11 is a sectional view illustrating the manufacturing method for the semiconductor device in the first embodiment.

Subsequently, as illustrated in FIG. 11, the anode electrode 6, which is the first electrode, is formed on the first principal plane 1a of the semiconductor substrate 1c. The anode electrode 6 is formed by forming aluminum (Al) on the first principal plane 1a of the semiconductor substrate 1c with sputtering or vapor deposition and, thereafter, performing sinter treatment for heating the semiconductor substrate 1c. The anode electrode 6 is formed in contact with the p type anode layer 2. To form the anode electrode 6, after the aluminum is formed by sputtering or vapor deposition, a nickel plating film or a copper plating film may be further formed on an aluminum film by electroless plating or electrolytic plating. Note that the anode electrode 6 does not always need to be formed before a back surface grinding step for the semiconductor substrate 1c explained below and may be formed after the process explained below. That is, a process for forming the anode electrode 6 may not necessarily be included in the formation process for the front surface structure in step S02 in FIG. 8.

Figure 12:
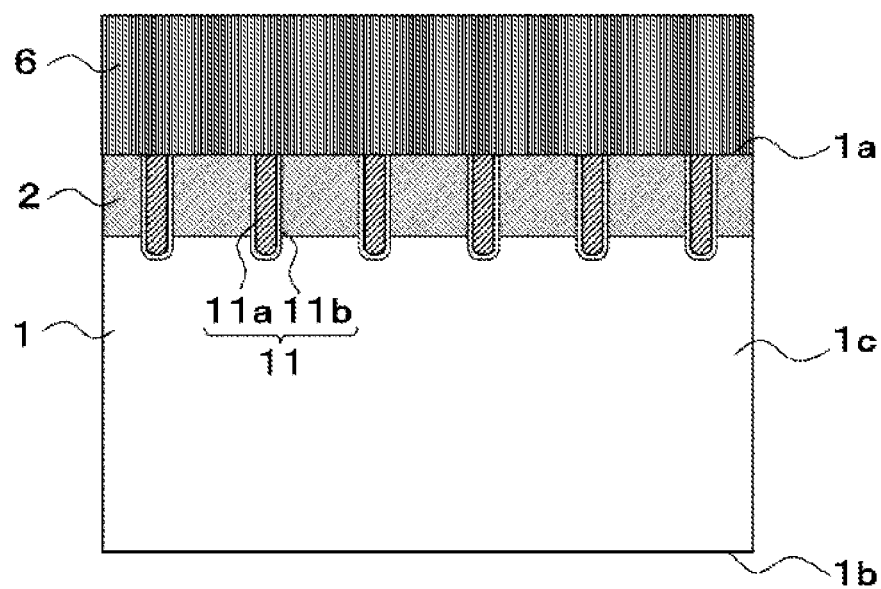
FIG. 12 is a sectional view illustrating the manufacturing method for the semiconductor device in the first embodiment.

Subsequently, in a back surface grinding step in step S03 in FIG. 8, the second principal plane 1b of the semiconductor substrate 1c is grinded to thin the semiconductor substrate 1c to a predetermined thickness as illustrated in FIG. 12. The thickness of the semiconductor substrate 1c after the grinding may be, for example, 80 μm to 200 μm. Strictly speaking, the second principal plane 1b of the semiconductor substrate 1c before the back surface grinding step is absent after the back surface grinding step. In the present disclosure, a surface opposed to the first principal plane 1a of the semiconductor substrate 1c is defined as the second principal plane 1b. That is, the second principal plane 1b is present closer to the first principal plane 1a as the semiconductor substrate 1c is further thinned by back surface grinding.

Figure 13:
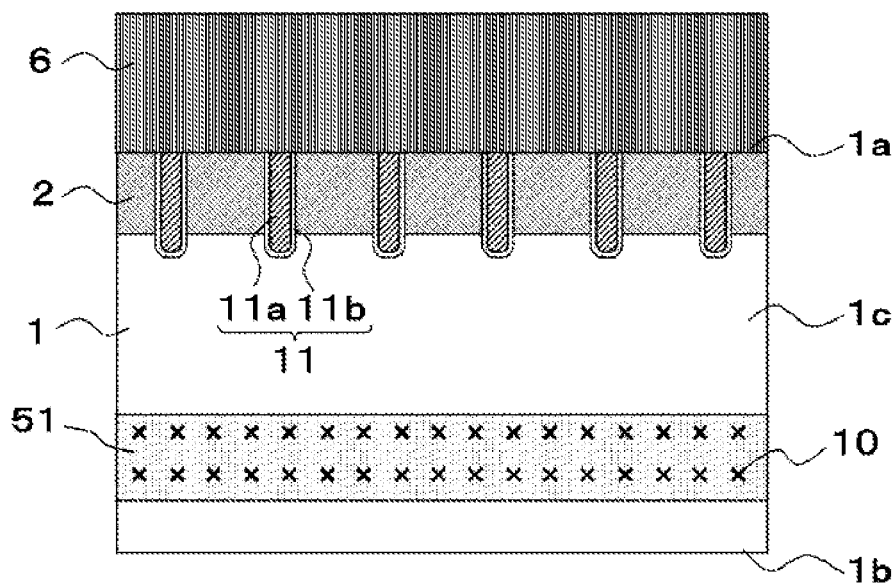
FIG. 13 is a sectional view illustrating the manufacturing method for the semiconductor device in the first embodiment.

Subsequently, in a proton injecting step in step S04 in FIG. 8, as illustrated in FIG. 13, protons 10 are injected into the semiconductor substrate 1c from the second principal plane 1b side of the semiconductor substrate 1c. The protons 10 are injected into a region 51 where the first buffer layer 5 is formed. Depth from the second principal plane 1b, to which the protons 10 are injected, can be adjusted by changing injection energy for the protons 10. In the semiconductor device 100 in the "example", the semiconductor device in the "comparative example 1", and the semiconductor device in the "comparative example 2" illustrated in FIG. 2, acceleration energies and injection amounts of the protons 10 are respectively set to 400 keV and $3.0 \times 10^{13}/cm^2$, 800 keV and $1.5 \times 10^{13}/cm^2$, 1200 keV and $8.0 \times 10^{12}/cm^2$, and 1500 keV and $4.0 \times 10^{12}/cm^2$ and the first buffer layer 5 is formed by four times of proton injection.

Note that, in the semiconductor device in the "comparative example 1" illustrated in FIG. 2, electron beam irradiation is performed with acceleration energy of 750 keV as charged particle irradiation from the first principal plane 1a side of the semiconductor substrate before proton injection. In the semiconductor device 100 in the "example" and the semiconductor device in the "comparative example 2", the electron beam irradiation is not performed before the proton injection. However, in the semiconductor device 100 in the first embodiment, the charged particle irradiation may be performed before the proton injection.

Figure 14:
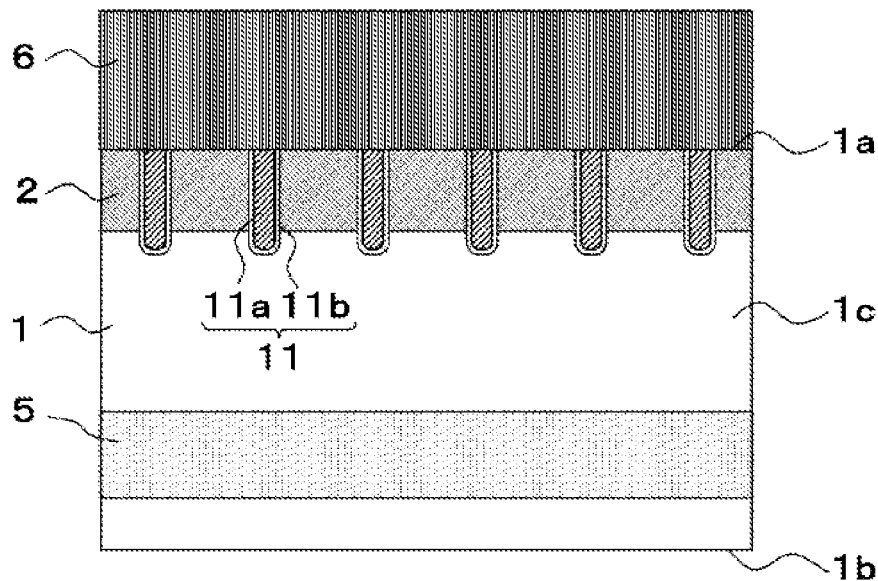
FIG. 14 is a sectional view illustrating the manufacturing method for the semiconductor device in the first embodiment.

Subsequently, in a first heat treatment step in step S05 in FIG. 8, the protons 10 injected into the semiconductor substrate 1*c* are converted into donors and the n type first buffer layer 5 including hydrogen-induced donors is formed as illustrated in FIG. 14. Note that, in FIG. 14, illustration of the protons 10 converted into the donors is omitted. In the first heat treatment step, the semiconductor substrate 1*c* is heated for 0.5 hour or more and four hours or less at first temperature of 380° C. or higher and 525° C. or lower. The first temperature lower than 380° C. is undesirable because the conversion of the injected protons 10 into donors is insufficient. The first temperature higher than 525° C. is undesirable because a defect occurs in the semiconductor substrate 1*c* during heating. In the first heat treatment step, heating may be performed in a nitrogen atmosphere. In the semiconductor device 100 in the "example", the semiconductor device in the "comparative example 1", and the semiconductor device in the "comparative example 2" illustrated in FIG. 2, the first temperature is set to 400° C. and heating is performed for two hours in the nitrogen atmosphere to convert the protons into donors.

Figure 15:
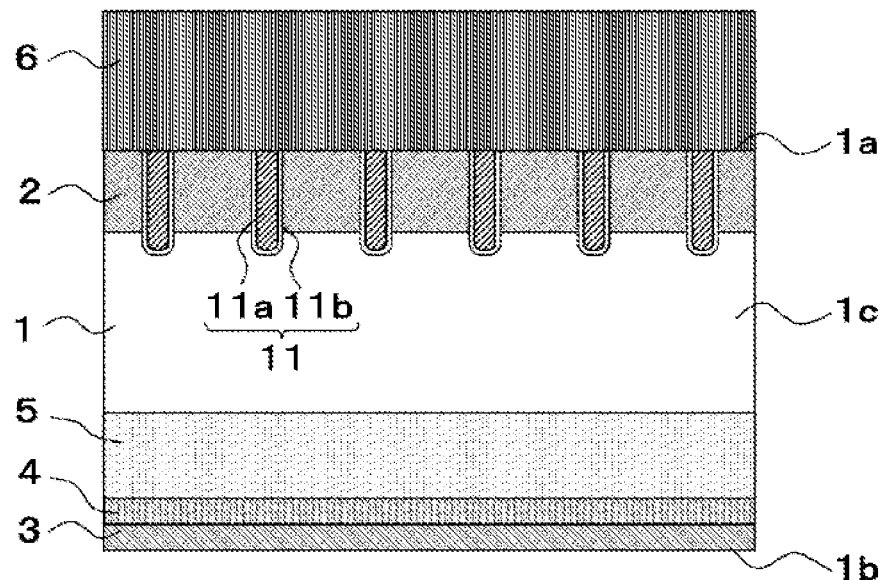
FIG. 15 is a sectional view illustrating the manufacturing method for the semiconductor device in the first embodiment.

Subsequently, in a forming step for a back surface structure in step S06 in FIG. 8, phosphorus is injected from the second principal plane 1*b* side of the semiconductor substrate 1*c* to form the second buffer layer 4 and arsenic or phosphorus is further injected from the second principal plane 1*b* side of the semiconductor substrate 1*c* to form the n$^+$ type cathode layer 3 as illustrated in FIG. 15. For example, in the second buffer layer 4, phosphorus may be injected with acceleration energy of 990 keV and an injection amount of $2.0 \times 10^{13}/cm^2$. In the n$^+$ type cathode layer 3, phosphorus may be injected with acceleration energy of 50 keV and an injection amount of $2.0 \times 10^5/cm^2$. Thereafter, laser anneal for irradiating the second principal plane 1*b* of the second semiconductor substrate 1*c* with a laser beam is performed to activate the phosphorus injected into the second buffer layer 4 and the arsenic or the phosphorus injected into the n$^+$ type cathode layer 3. Note that, in the laser anneal, the semiconductor substrate 1*c* is set in the air and the second principal plane 1*b* is irradiated with the laser beam. At this time, nitrogen may be blown against the second principal plane 1*b* irradiated with the laser beam to adjust an amount of oxygen taken into the semiconductor substrate 1*c*.

Note that the forming step for the back surface structure in step S06 in FIG. 8 only has to be performed before a charged particle irradiating step in step S07 and may be performed between the proton irradiating step in step S04 and the first heat treatment step in step S05 or between the back surface grinding step in step S03 and the proton injecting step in step S04. By performing the formation of the back surface structure in step S06 before the charged particle irradiating step in step S07, it is possible to also leave the CiOi formed in the charged particle irradiating step in step S07 in the second buffer layer 4 formed in the forming step for the back surface structure in step S06.

Figure 16:
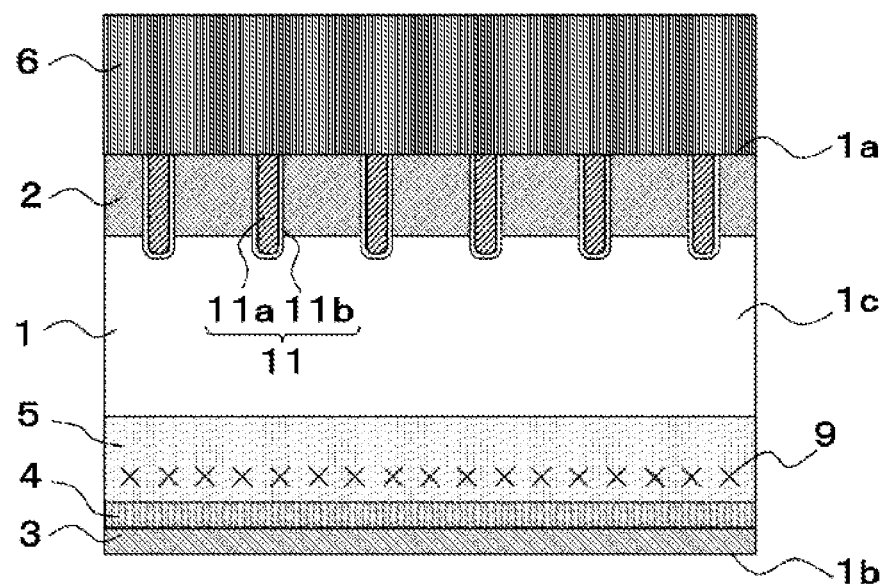
FIG. 16 is a sectional view illustrating the manufacturing method for the semiconductor device in the first embodiment.

Subsequently, in the charged particle irradiating step in step S07 in FIG. 8, the semiconductor substrate 1*c* is irradiated with charged particles from the first principal plane 1*a* side of the semiconductor substrate 1*c* or the second principal plane 1*b* side of the semiconductor substrate 1*c* to form the crystal defects 9 to be the lifetime killers in the semiconductor substrate 1*c* as illustrated in FIG. 16. At this time, the crystal defects 9 to be the lifetime killers are formed on the first buffer layer 5, the second buffer layer 4, and the n$^-$ type drift layer 1. The irradiated charged particles may be electrons or protons.

When the charged particles are protons, the protons may be irradiated with acceleration energy of 5 to 10 Mev using an irradiation device with which high acceleration energy is obtained such as a cyclotron. An aluminum absorber may be disposed on the first principal plane 1*a* side or the second principal plane 1*b* side of the semiconductor substrate 1*c* to decelerate the protons accelerated by the irradiation device and irradiate the semiconductor substrate 1*c* with the protons. By irradiating the protons with high acceleration energy of 5 to 10 Mev, it is possible to broadly distribute crystal defects formed in the semiconductor substrate 1*c*. By decelerating the protons with the aluminum absorber and injecting the protons, it is possible to control a peak depth of crystal defects formed in the semiconductor substrate 1*c*.

When the charged particles are electrons, since a range of the electrons is long, it is possible to form crystal defects in a region extending from the first principal plane 1*a* to the second principal plane 1*b* of the semiconductor substrate 1*c* irrespective of whether the semiconductor substrate 1*c* is irradiated with an electron beam from the first principal plane 1*a* side of the semiconductor substrate 1*c* or irradiated with the electron beam from the second principal plane 1*b* side of the semiconductor substrate 1*c*. Acceleration energy of the irradiated electrons may be, for example, 500 to 1000 keV. In the semiconductor device 100 in the "example" illustrated in FIG. 2, in the charged particle irradiating step in step S07 after the first heat treatment step, the electron beam irradiation is performed from the first principal plane 1*a* side of the semiconductor substrate 1*c* as charged particle irradiation with the acceleration energy of 750 keV. In the semiconductor devices in the "comparative example 1" and the "comparative example 2", electron beam irradiation is not performed after the first heat treatment step in step S05.

Subsequently, in a second heat treatment step in step S08 in FIG. 8, among the crystal defects formed in the semiconductor substrate 1*c* in the charged particle irradiating step in step S07, crystal defects that disappear at temperature lower than the second temperature are extinguished and crystal defects that do not disappear at the second temperature are left. The crystal defects that disappear at the temperature lower than the second temperature are, for example, the CiCs and the crystal defects that do not disappear at the second temperature is, for example, the CiOi. The protons injected into the semiconductor substrate 1*c* in the proton injecting step in step S04 are activated at 360° C. or more and converted into the hydrogen-induced donors. However, the second temperature is desirably temperature lower than 360° C. not contributing to the activation of the protons. In the second heat treatment step, the semiconductor substrate 1*c* is heated for ten minutes or more and two hours or less at the second temperature of 250° C. or higher and 350° C. or lower. In the semiconductor device 100 in the "example" illustrated in FIG. 2, the second temperature is set to 345° C. and the CiCs is heated in the nitrogen atmosphere for thirty minutes and extinguished.

As explained above, the CiCs disappears at approximately 300° C. but the CiOi disappears at approximately 400° C. Therefore, the CiCs can be extinguished at a larger rate than the CiOi by setting the second temperature in the second heat treatment step in step S08 to 250° C. or higher and 350° C. or lower.

Figure 17:
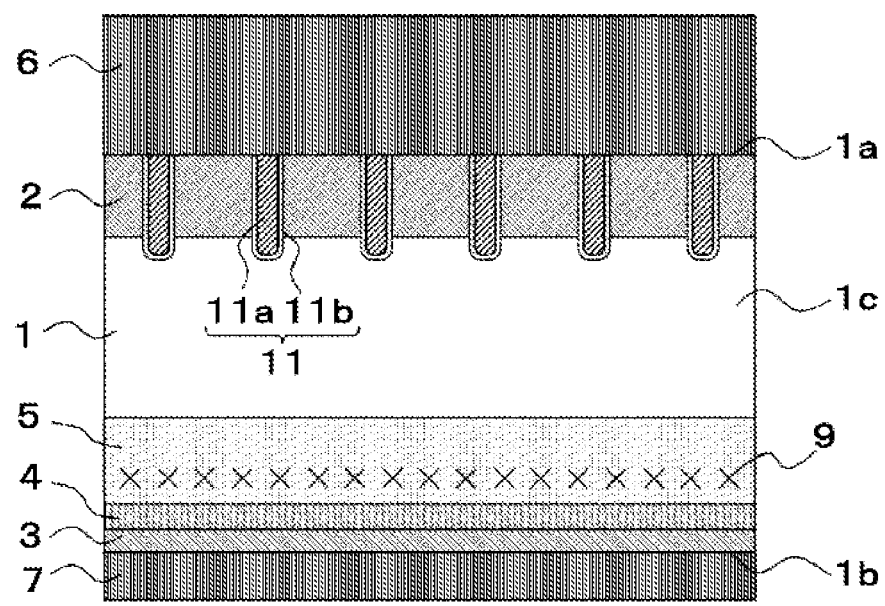
FIG. 17 is a sectional view illustrating the manufacturing method for the semiconductor device in the first embodiment.

Subsequently, the cathode electrode 7, which is the second electrode, is formed on the second principal plane 1b of the semiconductor substrate 1c as illustrated in FIG. 17. The semiconductor device 100 is completed by dicing the semiconductor substrate 1c into a predetermined size.

The cathode electrode 7, which is the second electrode, is formed through a film forming step for forming, with sputtering or vapor deposition, a metal film including at least one of Al, Ti, Ni, Au, Ag, and Cu on the n$^+$ type cathode layer 3, which is the second semiconductor layer, formed on the second principal plane 1b side of the semiconductor substrate 1c and a sinter treatment step for, thereafter, heating the metal film and performing sinter treatment. Temperature for the heating in the sinter treatment step may be equal to the second temperature in the second heat treatment step and may be, for example, 250° C. or higher and 350° C. or lower. Therefore, the second heat treatment step in step S08 may be performed after the film forming step for forming the cathode electrode 7. The second heat treatment step may be performed as the sinter treatment step as well. Since the second heat treatment step is performed as the sinter treatment step as well, it is possible to simplify the manufacturing process for the semiconductor device 100 and reduce cost of the semiconductor device 100.

Note that the film forming step and the sinter treatment step for forming the cathode electrode 7, which is the second electrode, may be performed before the charged particle irradiating step in step S07. In this case, the heating temperature in the sinter treatment step may be set higher than the second temperature in the second heat treatment step. The heating temperature in the sinter treatment step may be temperature lower than the first temperature in the first heat treatment step and higher than the second temperature in the second heat treatment step. On the other hand, when the sinter treatment step is performed after the second heat treatment step in step S08, the heating temperature in the sinter treatment step is desirably temperature lower than the second temperature in the second heat treatment step. By setting the heating temperature in the sinter treatment step performed after the second heat treatment step lower than the second temperature, it is possible to prevent the CiOi left in the second heat treatment step from disappearing in the sinter treatment step.

The semiconductor device 100 in the first embodiment is manufactured by the processes explained above.

As explained above, the semiconductor device 100 in the first embodiment includes more CiOi compared with the CiCs as the crystal defects 9 to be the lifetime killers in the semiconductor substrate. The semiconductor device 100 includes more CiOi compared with the CiCs in the n$^-$ type drift layer 1 and includes more CiOi compared with the CiCs in the first buffer layer 5 and the second buffer layer 4 as well.

Since the semiconductor device 100 is formed using the semiconductor substrate of silicon, a maximum temperature during operation in an actual use is approximately 175° C. The crystal defects formed in the semiconductor substrate as the lifetime killers gradually disappear when the semiconductor device 100 is continuously used for a long time in the actual use even at temperature of 175° C. that is low for recovery of the crystal defects. Electric characteristics such as switching speed fluctuates. That is, in the manufacturing method for the semiconductor device 100 illustrated in FIG. 8, when the second heat treatment step in step S08 is not performed, the CiOi and the CiCs remain as the crystal defects 9 to be the lifetime killers in the semiconductor substrate. However, both of the CiOi and the CiCs disappear when the semiconductor device 100 is continuously used for a long time at 175° C. Therefore, the variation of the electric characteristics increases to make it difficult to guarantee long-term quality. In particular, since CiCs disappears at lower temperature than the CiOi, a rate of disappearance of the CiCs is larger than a rate of disappearance of the CiOi in a long-term use. It is difficult to guarantee the long-term quality when the CiCs remains.

On the other hand, in the semiconductor device 100 in the first embodiment, the CiCs is extinguished more than the CiOi in the second heat treatment step in step S08 in FIG. 8. Therefore, as illustrated in FIGS. 4 and 5, the semiconductor device 100 includes more CiOi than the CiCs in the first buffer layer 5, the second buffer layer 4, and the n$^-$ type drift layer 1. Since temperature at which the CiOi disappears according to the recovery of the crystal defects is higher than the temperature for the CiCs, in the semiconductor device 100 in the first embodiment in which the residual amount of the CiCs is small and more CiOi remains, even if the semiconductor device 100 is continuously used for a long time at 175° C., variation in electric characteristics such as switching speed is small. It is possible to stabilize the electric characteristics and it is easy to guarantee long-term quality.

Second Embodiment

Figure 18:
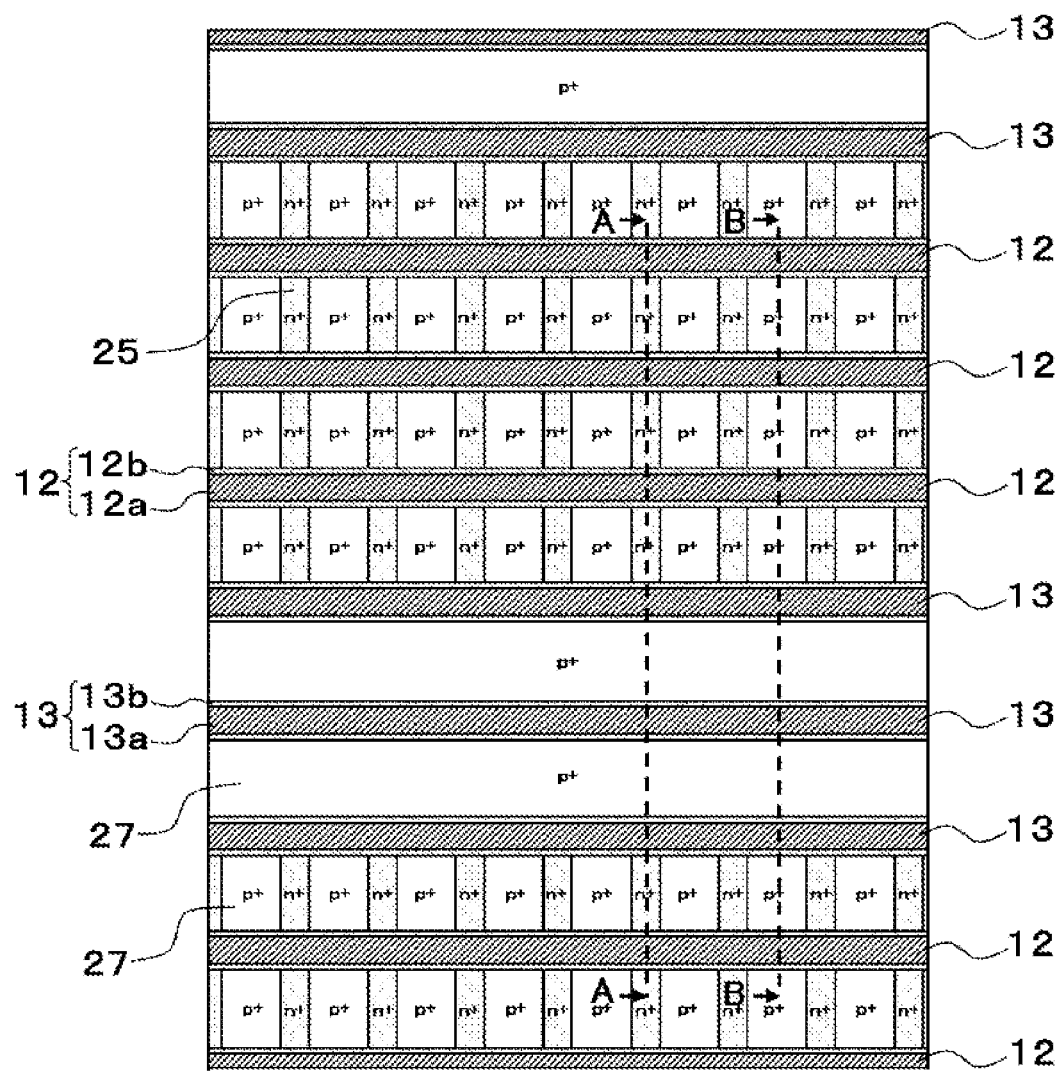
FIG. 18 is a plan view illustrating the configuration of a semiconductor device in a second embodiment.
Figure 19:
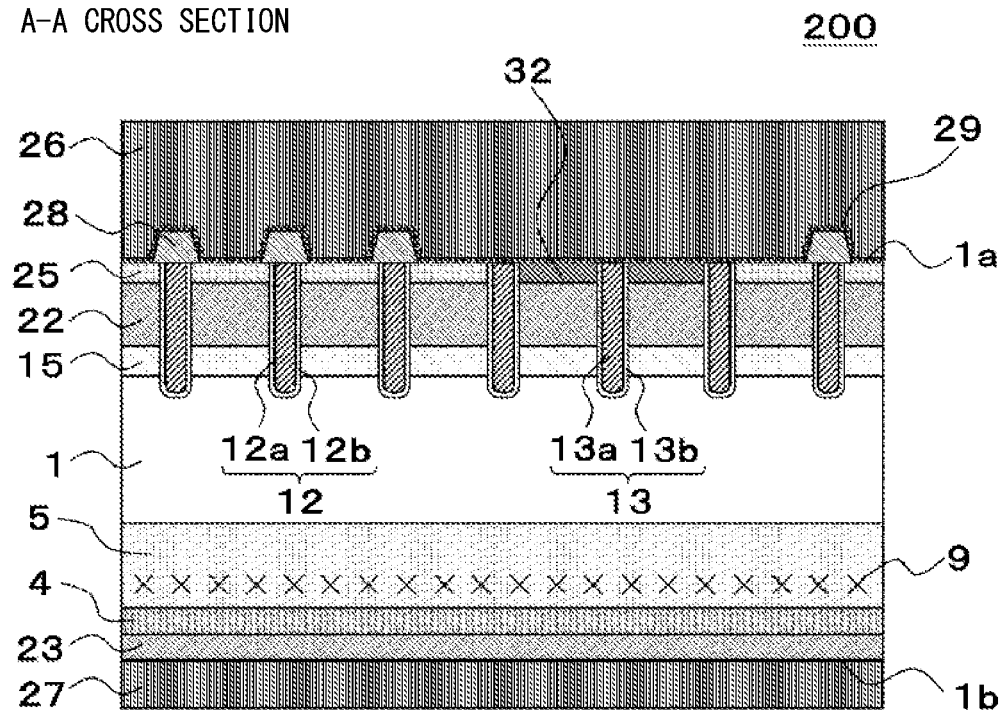
FIG. 19 is a sectional views taken along a broken line A-A of a semiconductor device 200 illustrated in FIG. 18.
Figure 20:
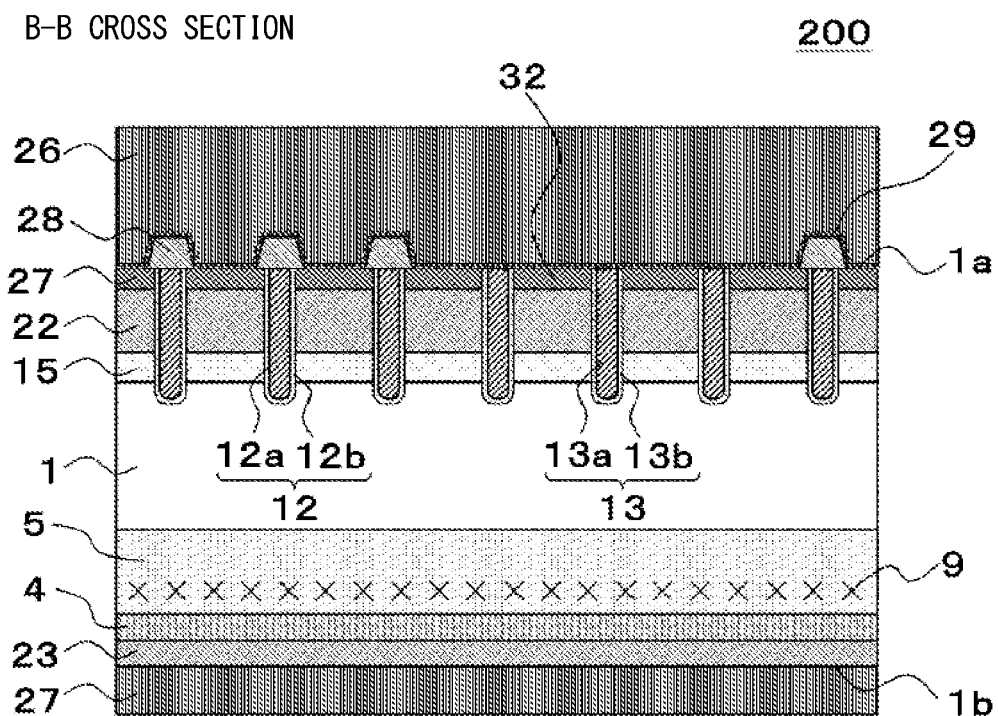
FIG. 20 is a sectional views taken along a broken line B-B of a semiconductor device 200 illustrated in FIG. 18.

FIG. 18 is a plan view illustrating the configuration of a semiconductor device in a second embodiment. FIGS. 19 and 20 are sectional views illustrating the configuration of the semiconductor device in the second embodiment. FIG. 19 is a sectional view taken along a broken line A-A of a semiconductor device 200 illustrated in FIG. 18. FIG. 20 is a sectional view taken along a broken line B-B of the semiconductor device 200 illustrated in FIG. 18. In FIG. 18, components denoted by the same reference numerals and signs as the reference numerals and signs in FIG. 1 are the same or corresponding components. Explanation about the components is omitted. The semiconductor device 200 in the second embodiment is an IGBT (Insulated Gate Bipolar Transistor).

As illustrated in FIG. 18, in the semiconductor device 200, active trench gates 12 and dummy trench gates 13 are provided in a stripe shape. The active trench gates 12 are formed by providing, via gate trench insulating films 12b, gate trench electrodes 12a in trenches formed in a semiconductor substrate. The dummy trench gates 13 are formed by providing, via dummy trench insulating films 13b, dummy trench electrodes 13a in trenches formed in the semiconductor substrate. The gate trench electrodes 12a of the active trench gates 12 are electrically connected to gate pads (not illustrated). The dummy trench electrodes 13a of the dummy trench gates 13 are electrically connected to an emitter electrode 26, which is a first electrode, provided on a first principal plane 1a of the semiconductor device 200.

On both the sides in the width direction of the active trench gates 12, n$^+$ type source layers 25 are provided in contact with the gate trench insulating films 12b. The n$^+$ type source layers 25 are semiconductor layers having, for example, arsenic or phosphorus as an n type impurity. The concentration of the n type impurity is $1.0 \times 10^{11}/\text{cm}^3$ to $1.0 \times 10^{20}/\text{cm}^3$. The n$^+$ type source layers 25 are provided alternately with p$^+$ type contact layers 32 along an extending direction of the active trench gates 12. The p$^+$ type contact layer 32 is also provided between adjacent two dummy trench gates 13. Further, the p$^+$ type contact layers 32 are semiconductor layers having, for example, boron or aluminum as a p type impurity. The concentration of the p type impurity is $1.0\times10^5/cm^3$ to $1.0\times10^{20}/cm^3$.

As illustrated in FIG. 18, the semiconductor device 200 has a configuration in which three active trench gates 12 are arranged, three dummy trench gates 13 are arrange next to the three active trench gates 12, and three active trench gates 12 are arranged next to the three dummy trench gates 13. The semiconductor device 200 has a configuration in which sets of the active trench gates 12 and sets of the dummy trench gates 13 are alternately arranged. In FIG. 18, the number of the active trench gates 12 included in one set of the active trench gates 12 is three but only has to be one or more. The number of the dummy trench gates 13 included in one set of the dummy trench gates 13 may be one or more. The number of the dummy trench gates 13 may be zero. That is, all the trenches provided in the semiconductor device 200 may be the active trench gates 12.

FIG. 19 is a sectional view taken along a broken line A-A in FIG. 18 of the semiconductor device 200. As illustrated in FIG. 19, in the semiconductor device 200, an n type carrier storage layer 15 having higher concentration of the n type impurity than the n⁻ type drift layer 1 is provided on the first principal plane 1a side of the n⁻ type drift layer 1. The n type carrier storage layer 15 is a semiconductor layer having, for example, arsenic or phosphorus as the n type impurity. The concentration of the n type impurity is $1.0\times10^3/cm^3$ to $1.0\times10^{17}/cm^3$. Note that the semiconductor device 200 may have a configuration in which the n type carrier storage layer 15 is not provided and the n⁻ type drift layer 1 is also provided in a region of the n type carrier storage layer 15 illustrated in FIG. 19. By providing the n type carrier storage layer 15, it is possible to reduce an energization loss at the time when an electric current flows to the semiconductor device 200. The n type carrier storage layer 15 and the n⁻ type drift layer 1 may be collectively referred to as drift layer.

A p type base layer 22 is provided as a first semiconductor layer on the first principal plane 1a side of the n type carrier storage layer 15. The p type base layer 22 is a semiconductor layer having, for example, boron or aluminum as a p type impurity. The concentration of the p type impurity is $1.0\times10^{12}/cm^3$ to $1.0\times10^{19}/cm^3$. The p type base layer 22 is in contact with the gate trench insulating films 12b of the active trench gates 12. On the first principal plane 1a side of the p type base layer 22, the n⁺ type source layers 25 are provided in contact with the gate trench insulating films 12b of the active trench gates 12. The p⁺ type contact layers 32 are provided in the remaining region. The n⁺ type source layers 25 and the p⁺ type contact layers 32 form the first principal plane 1a of the semiconductor substrate. Note that the p⁺ type contact layers 32 are regions where the concentration of the p type impurity is higher than in the p type base layer 22. When it is necessary to distinguish the p⁺ type contact layers 32 and the p type base layer 22, the p⁺ type contact layers 32 and the p type base layer 22 may be respectively individually referred to. The p⁺ type contact layers 32 and the p type base layer 22 may be collectively referred to as p type base layer. In the semiconductor device 200 in the second embodiment, the first semiconductor layer refers to the p type base layer.

In the semiconductor device 200, as in the semiconductor device 100 in the first embodiment, the first buffer layer 5 and the second buffer layer 4 are provided on the second principal plane 1b side of the n⁻ type drift layer 1. The configuration and a forming method of the first buffer layer 5 and the second buffer layer 4 are as explained in the first embodiment. The first buffer layer 5 includes the crystal defects 9 to be lifetime killers. Although not illustrated, the second buffer layer 4 also includes the crystal defects 9 to be the lifetime killers and the n⁻ type drift layer 1 also includes the crystal defects 9 to be the lifetime killers. As explained in the first embodiment, the crystal defects 9 to be the lifetime killers included in the semiconductor device 200 are the CiOi, the CiCs, the ISi3, or the ISi4. The density of the CiOi of the first buffer layer 5, the second buffer layer 4, and the n⁻ type drift layer 1 is larger than the density of the CiCs of the layers.

In the semiconductor device 200, a p type collector layer 23 is provided as a second semiconductor layer on the second principal plane 1b side of the second buffer layer 4. That is, the p type collector layer 23 is provided between the first buffer layer 5 and the second principal plane 1b. The p type collector layer 23 is a semiconductor layer including for example, boron or aluminum as a p type impurity. The concentration of the p type impurity is $1.0\times10^6/cm^3$ to $1.0\times10^{20}/cm^3$. The p type collector layer 23 forms the second principal plane 1b of the semiconductor substrate.

As illustrated in FIG. 19, in the semiconductor device 200, trenches passing through the p type base layer 22 from the first principal plane 1a of the semiconductor substrate and reaching the n⁻ type drift layer 1 are formed. The active trench gates 12 are formed by providing the gate trench electrodes 12a in the trenches via the gate trench insulating films 12b. The gate trench electrodes 12a are opposed to the n⁻ type drift layer 1 via the gate trench insulating films 12b. The dummy trench gates 13 are formed by providing the dummy trench electrodes 13a in the trenches via the dummy trench insulating films 13b. The dummy trench electrodes 13a are opposed to the n⁻ type drift layer 1 via the dummy trench insulating films 13b. The gate trench insulating films 12b of the active trench gates 12 are in contact with the p type base layer 22 and the n⁺ type source layers 25. When a gate driving voltage is applied to the gate trench electrodes 12a, channels are formed in the p type base layer 22 in contact with the gate trench insulating films 12b of the active trench gates 12.

As illustrated in FIG. 19, interlayer insulating films 28 are provided on the gate trench electrodes 12a of the active trench gates 12. Barrier metal 29 is formed on regions where the interlayer insulating films 28 are not provided of the first principal plane 1a of the semiconductor substrate and on the interlayer insulating films 28. The barrier metal 29 may be, for example, a conductor including titanium (Ti), may be, for example, titanium nitride, or may be TiSi obtained by alloying titanium and silicon (Si). As illustrated in FIG. 19, the barrier metal 29 is in ohmic contact with the n⁺ type source layers 25, the p⁺ type contact layers 32, and the dummy trench electrodes 13a and electrically connected to the n⁺ type source layers 25, the p⁺ type contact layers 32, and the dummy trench electrodes 13a.

An emitter electrode 26 is provided on the barrier metal 29. The emitter electrode 26 has the same configuration as the configuration of the anode electrode 6 of the semiconductor device 100 explained in the first embodiment. When there are fine regions among the interlayer insulating films 28 adjacent one another or the like, the regions being not satisfactorily embedded by the emitter electrode 26, tungsten having a better embedding property than the emitter electrode 26 may be disposed in the fine regions and the emitter electrode 26 may be provided on the tungsten. Note that the emitter electrode 26 may be provided on the n⁺ type source layers 25, the p⁺ type contact layers 32, and the dummy trench electrodes 13a without providing the barrier metal 29. The barrier metal 29 may be provided only on n type semiconductor layers such as the n+ type source layers 25. The barrier metal 29 and the emitter electrode 26 may be collectively referred to as an emitter electrode, which is a first electrode.

Note that, in FIG. 19, the interlayer insulating films 28 are not provided on the dummy trench electrodes 13a of the dummy trench gates 13. However, the interlayer insulating films 28 may be formed on the dummy trench electrodes 13a of the dummy trench gates 13. When the interlayer insulating films 28 are formed on the dummy trench electrodes 13a of the dummy trench gates 13, the emitter electrode 26 and the dummy trench electrodes 13a only have to be electrically connected on another cross section.

A collector electrode 27, which is a second electrode, is provided on the second principal plane 1b side of the p type collector layer 23. The collector electrode 27 may have the same configuration as the configuration of the cathode electrode 7 of the semiconductor device 100 explained in the first embodiment. The collector electrode 27 is in ohmic contact with the p type collector layer 23 and electrically connected to the p type collector layer 23.

FIG. 20 is a sectional view taken along a broken line B-B in FIG. 18 of the semiconductor device 200. The sectional view is different from the sectional view taken along the broken line A-A illustrated in FIG. 19 in that the n+ type source layers 25 provided on the first principal plane 1a side of the semiconductor substrate in contact with the active trench gates 12 are not seen on a cross section taken along the broken line B-B in FIG. 20. That is, as illustrated in FIG. 18, the n+ type source layers 25 are selectively provided on the first principal plane 1a side of the p type base layer 22. Note that the p type base layer 22 and the p+ type contact layers 32 are collectively referred to as the p type base layer.

In the semiconductor device 200 as well, a measurement result indicating a density change of the CiOi with respect to the depth from the second principal plane 1b of the semiconductor device same as the measurement result illustrated in FIG. 4 is obtained from photoluminescence of a C-line due to the CiOi. A measurement result indicating a density change of the CiCs with respect to the depth from the second principal plane 1b of the semiconductor device same as the measurement result illustrated in FIG. 5 is obtained from photoluminescence of a G-line due to the CiCs.

Like the semiconductor device 100 in the first embodiment, the semiconductor device 200 includes, in the semiconductor substrate, ISi3 or ISi4, which is a complex defect of interstice silicon. In the semiconductor device 200 as well, a measurement result indicating a density change of the ISi3 with respect to the depth from the second principal plane 1b of the semiconductor device same as the measurement result illustrated in FIG. 6 is obtained from photoluminescence of a W-line due to the ISi3. A measurement result indicating a density change of the ISi4 with respect to the depth from the second principal plane 1b of the semiconductor device same as the measurement result illustrated in FIG. 7 is obtained from photoluminescence of a X-line due to the ISi4.

Like the semiconductor device 100 in the first embodiment, the semiconductor device 200 includes, in the semiconductor substrate, more CiOi compared with the CiCs as the crystal defects 9 to be the lifetime killers. The semiconductor device 200 includes more CiOi compare with the CiCs in the n− type drift layer 1 and includes more CiOi compared with the CiCs in the first buffer layer 5 and the second buffer layer 4 as well. As a result, the semiconductor device 200 in the second embodiment achieves the same effects as the effects of the semiconductor device 100 in the first embodiment.

Third Embodiment

Figure 21:
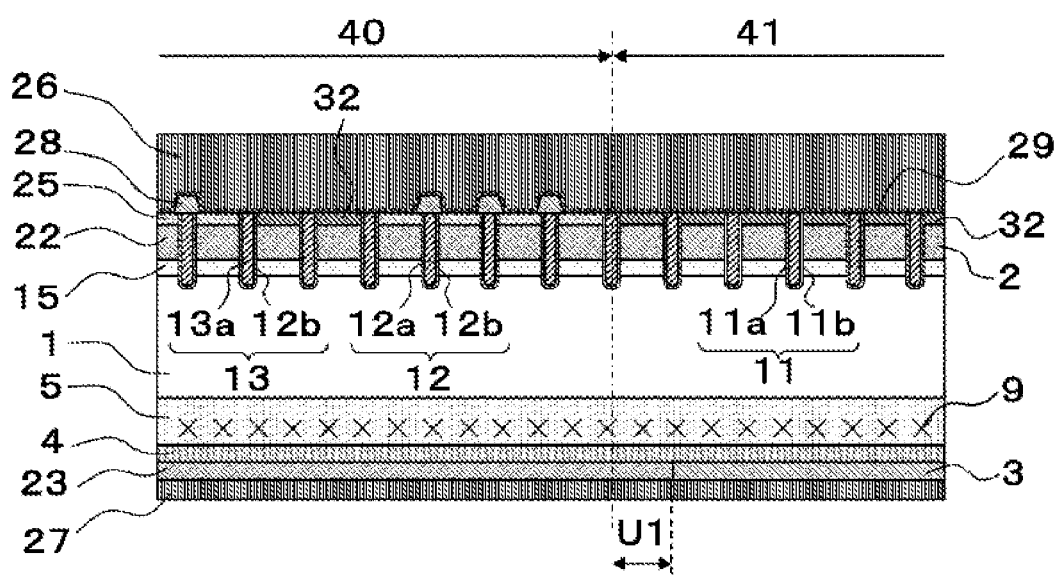
FIG. 21 is a sectional view illustrating a semiconductor device in the third embodiment.

FIG. 21 is a sectional view illustrating a semiconductor device in the third embodiment. In FIG. 21, components denoted by the same reference numerals and signs as the reference numerals and signs in FIG. 1, 19, or 20 are the same or corresponding components. Explanation about the components is omitted. In the first embodiment, the semiconductor device 100 is a diode. In the second embodiment, the semiconductor device 200 is the IGBT. A semiconductor device 300 in the third embodiment is an RC-IGBT (Reverse Conducting IGBT) in which an IGBT region 40 and a diode region 41 are provided in one semiconductor substrate.

The semiconductor device 300 includes one or more IGBT regions 40 and one or more diode regions 41 in one semiconductor substrate (semiconductor chip) and has a configuration in which the IGBT regions 40 and the diode regions 41 are alternately provided in a stripe shape, a configuration in which the IGBT regions 40 are provided to surround the diode regions 41 provided to be scattered in an island shape, or a configuration in which the diode regions 41 are provided to surround the IGBT regions 40 provided to be scattered in an island shape.

The IGBT region 40 and the diode region 41 form a cell region. A terminal end region is provided between the cell region and the outer peripheral edge of the semiconductor substrate (the semiconductor chip) to surround the cell region. The first buffer layer 5, the second buffer layer 4, and the n− type drift layer 1 are provided in the terminal end region as well. The first buffer layer 5, the second buffer layer 4, or the n− type drift layer 1 in the terminal end region may include the crystal defects 9 to be lifetime killers.

As illustrated in FIG. 21, the configuration of the IGBT region 40 of the semiconductor device 300 is the same as the configuration of the semiconductor device 200, which is the IGBT, explained in the second embodiment. The configuration of the diode region 41 of the semiconductor device 300 is the same as the configuration of the semiconductor device 100, which is the diode, explained in the first embodiment but is different in that the diode region 41 includes the n type carrier storage layer 15 between the p type anode layer 2 and the n− type drift layer 1 and includes the p+ type contact layers 32 between the p type anode layer 2 and the first principal plane 1a. The configuration of the diode region 41 is different in that the n+ type cathode layer 3 is not provided and the p type collector layer 23 is provided over a range of a distance U1 from a boundary between the IGBT region 40 and the diode region 41 to the diode region 41 side. Note that the diode region 41 may have a configuration in which, unlike the semiconductor device 100 explained in the first embodiment, the n type carrier storage layer 15 or the p+ type contact layers 32 are not provided and the n+ type cathode layer 3 is also provided in the range of the distance U1 from the boundary between the IGBT region 40 and the diode region 41 to the diode region 41 side.

In the semiconductor device 300 in the third embodiment, in the IGBT region 40, a first semiconductor layer is a p type base layer obtained by combining the p type base layer 22 and the p+ type contact layers 32 and, in the diode region 41, the first semiconductor layer is an anode layer obtained by combining the p type anode layer 2 and the p+ type contact layers 32. A second semiconductor layer is the p type collector layer 23 in the IGBT region 40 and is the n⁺ type cathode layer 3 in the diode region 41.

An anode electrode, which is a first electrode, of the diode region 41 of the semiconductor device 300 is formed integrally with the emitter electrode 26 of the IGBT region 40. A cathode electrode, which is a second electrode, of the diode region 41 is formed integrally with the collector electrode 27 of the IGBT region 40.

As illustrated in FIG. 21, the semiconductor device 300 includes the crystal defects 9 to be the lifetime killers in the first buffer layer 5 of the IGBT region 40 and the first buffer layer 5 of the diode region 41. Although not illustrated, the semiconductor device 300 includes the crystal defects 9 to be the lifetime killers in the second buffer layer 4 of the IGBT region 40 and the first buffer layer 5 of the diode region 41 as well and includes the crystal defects 9 to be the lifetime killers in the n⁻ type drift layer 1 of the IGBT region 40 and the n⁻ type drift layer 1 of the diode region 41 as well. As explained in the first embodiment, the crystal defects 9 to be the lifetime killers included in the semiconductor device 300 are the CiOi, the CiCs, the ISi3, or the ISi4. The density of the CiOi of the first buffer layer 5, the second buffer layer 4, and the n⁻ type drift layer 1 is larger than the density of the CiCs of the layers.

In the semiconductor device 300 as well, a measurement result indicating a density change of the CiOi with respect to the depth from the second principal plane 1b of the semiconductor device same as the measurement result illustrated in FIG. 4 is obtained from photoluminescence of a C-line due to the CiOi. A measurement result indicating a density change of the CiCs with respect to the depth from the second principal plane 1b of the semiconductor device same as the measurement result illustrated in FIG. 5 is obtained from photoluminescence of a G-line due to the CiCs.

Like the semiconductor device 100 in the first embodiment, the semiconductor device 300 includes, in the semiconductor substrate, ISi3 or ISi4, which is a complex defect of interstice silicon. In the semiconductor device 300 as well, a measurement result indicating a density change of the ISi3 with respect to the depth from the second principal plane 1b of the semiconductor device same as the measurement result illustrated in FIG. 6 is obtained from photoluminescence of a W-line due to the ISi3. A measurement result indicating a density change of the ISi4 with respect to the depth from the second principal plane 1b of the semiconductor device same as the measurement result illustrated in FIG. 7 is obtained from photoluminescence of a X-line due to the ISi4.

Like the semiconductor device 100 in the first embodiment, the semiconductor device 300 includes, in the semiconductor substrate, more CiOi compared with the CiCs as the crystal defects 9 to be the lifetime killers. The semiconductor device 300 includes more CiOi compare with the CiCs in the n⁻ type drift layer 1 and includes more CiOi compared with the CiCs in the first buffer layer 5 and the second buffer layer 4 as well. As a result, the semiconductor device 300 in the third embodiment achieves the same effects as the effects of the semiconductor device 100 in the first embodiment.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-170457, filed on Oct. 8, 2020 including specification, claims, drawings and summary, on which the convention priority of the present application is based, is incorporated herein by reference in its entirety.

The invention claimed is:

1. A semiconductor device comprising:
    a drift layer of a first conduction type provided in a semiconductor substrate having a first principal plane and a second principal plane opposed to the first principal plane;
    a first semiconductor layer of a second conduction type provided between the first principal plane of the semiconductor substrate and the drift layer and having an impurity concentration higher than an impurity concentration of the drift layer;
    a first buffer layer of the first conduction type provided between the second principal plane of the semiconductor substrate and the drift layer and having hydrogen-induced donors with an impurity concentration higher than the impurity concentration of the drift layer; and
    a second semiconductor layer of the first conduction type or the second conduction type provided between the second principal plane of the semiconductor substrate and the first buffer layer and having an impurity concentration higher than the impurity concentration of the drift layer,
    wherein the first buffer layer includes a complex defect of interstice carbon and interstice oxygen having a density decreasing from a second principal plane side toward a first principal plane side.

2. The semiconductor device according to claim 1, wherein the density of the complex defect of interstice carbon and interstice oxygen in the first buffer layer is larger than a density of a complex defect of interstice carbon and lattice position carbon in the first buffer layer.

3. The semiconductor device according to claim 1, wherein the complex defect of interstice carbon and interstice oxygen is a lifetime killer which reduces a recombination life time of a carrier.

4. The semiconductor device according to claim 1, wherein the first buffer layer includes a complex defect of interstice silicon having a density decreasing from the second principal plane side toward the first principal plane side, and
    the first buffer layer includes a region where a decreasing rate of density of the complex defect of interstice carbon and interstice oxygen increases and a decreasing rate of density of the complex defect of interstice silicon decreases from the second principal plane side toward the first principal plane side.

5. The semiconductor device according to claim 1, wherein the first buffer layer has at least one concentration peak of the hydrogen-induced donors, and
    the complex defect of interstice carbon and interstice oxygen is present further on the first principal plane side than the concentration peak closest to the first principal plane among the concentration peaks of the hydrogen-induced donors.

6. The semiconductor device according to claim 1, further comprising a second buffer layer of the first conduction type provided between the second semiconductor layer and the first buffer layer, having phosphorus as impurities and having an impurity concentration higher than the impurity concentration of the first buffer layer,
    wherein the second buffer layer includes the complex defect of interstice carbon and interstice oxygen, and
    a density of the complex defect of interstice carbon and interstice oxygen of the second buffer layer is smaller than a maximum density of the complex defect of interstice carbon and interstice oxygen of the first buffer layer.

7. The semiconductor device according to claim 1, wherein the second semiconductor layer is a collector layer of the second conduction type.

8. The semiconductor device according to claim 1, wherein the second semiconductor layer is a cathode layer of the first conduction type.

9. The semiconductor device according to claim 1, wherein the semiconductor substrate includes an IGBT region in which the second semiconductor layer is a collector layer of the second conduction type, and a diode region in which the second semiconductor layer is a cathode layer of the first conduction type.

10. The semiconductor device according to claim 1, wherein the complex defect of interstice carbon and interstice oxygen is formed by charged particle irradiation, and a heat treatment step after the charged particle irradiation is:
   at a temperature of 250° C. or higher and 350° C. or lower, and
   for a time of ten minutes or higher and two hours or lower,
   such that the density of the complex defect of interstice carbon and interstice oxygen in the first buffer layer is larger than a density of the complex defect of interstice carbon and lattice position carbon in the first buffer layer.

11. The semiconductor device according to claim 10, wherein the hydrogen-induced donors are formed by another heat treatment step performed before the charged particle irradiation, the another heat treatment step being:
   at a temperature of 380° C. or higher and 525° C. or lower, and
   for a time of 0.5 hours or higher and four hours or lower.

* * * * *